(12) United States Patent
Nakanishi et al.

(10) Patent No.: US 11,594,514 B2
(45) Date of Patent: Feb. 28, 2023

(54) SEMICONDUCTOR DEVICE AND METHOD OF MANUFACTURING THE SAME

(71) Applicant: Kioxia Corporation, Minato-ku (JP)

(72) Inventors: Kazuhiro Nakanishi, Yokkaichi (JP); Shigehiro Yamakita, Yokkaichi (JP); Kazuhiro Nojima, Mie (JP); Kenichi Kadota, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 181 days.

(21) Appl. No.: 16/816,571

(22) Filed: Mar. 12, 2020

(65) Prior Publication Data

US 2021/0057376 A1    Feb. 25, 2021

(30) Foreign Application Priority Data

Aug. 23, 2019 (JP) .............................. JP2019-153110

(51) Int. Cl.
*H01L 23/00* (2006.01)

(52) U.S. Cl.
CPC .............. *H01L 24/89* (2013.01); *H01L 24/05* (2013.01); *H01L 24/08* (2013.01); *H01L 2224/05026* (2013.01); *H01L 2224/05563* (2013.01); *H01L 2224/08147* (2013.01); *H01L 2224/80895* (2013.01); *H01L 2224/80896* (2013.01)

(58) Field of Classification Search
None
See application file for complete search history.

(56) References Cited

U.S. PATENT DOCUMENTS

| 9,799,587 | B2 | 10/2017 | Fujii et al. | |
| 10,297,578 | B2 | 5/2019 | Tagami et al. | |
| 2019/0221545 | A1* | 7/2019 | Cao | .......................... H01L 24/33 |
| 2020/0058617 | A1* | 2/2020 | Wu | .......................... H01L 24/33 |
| 2020/0409592 | A1* | 12/2020 | Yang | .................. H01L 27/11582 |

FOREIGN PATENT DOCUMENTS

| JP | 2010-129686 A | 6/2010 |
| TW | 201832340 A | 9/2018 |
| TW | 201933546 A | 8/2019 |

\* cited by examiner

*Primary Examiner* — Michelle Mandala
(74) *Attorney, Agent, or Firm* — Oblon, McClelland, Maier & Neustadt, L.L.P.

(57) ABSTRACT

In one embodiment, a semiconductor device includes a substrate, a lower pad provided above the substrate, and an upper pad provided on the lower pad. The lower pad includes a first pad and a plurality of first connection portions provided on the first pad, and the upper pad is provided on the plurality of first connection portions, or the upper pad includes a second pad and a plurality of second connection portions provided under the second pad, and the lower pad is provided under the plurality of second connection portions.

9 Claims, 22 Drawing Sheets

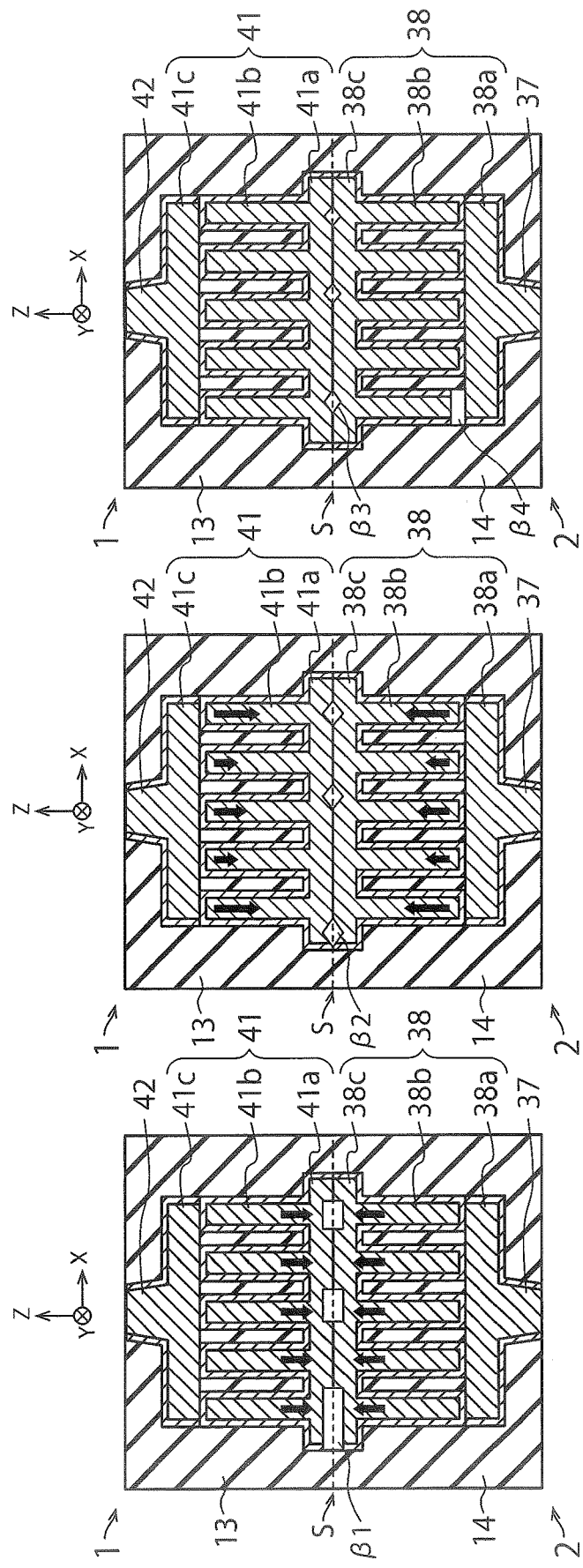

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-153110, filed on Aug. 23, 2019, the entire contents of which are incorporated herein by reference.

FIELD

Embodiments described herein relate to a semiconductor device and a method of manufacturing the same.

BACKGROUND

In a case where metal pads in wafers are bonded together to manufacture a semiconductor device, it is desired to prevent lowering of a yield due to the metal pads or the like.

BRIEF DESCRIPTION OF THE DRAWINGS

FIGS. 8A to 8C are sectional views for explaining advantages of the metal pad, or the like, in the first embodiment;

DETAILED DESCRIPTION

Figure 1:
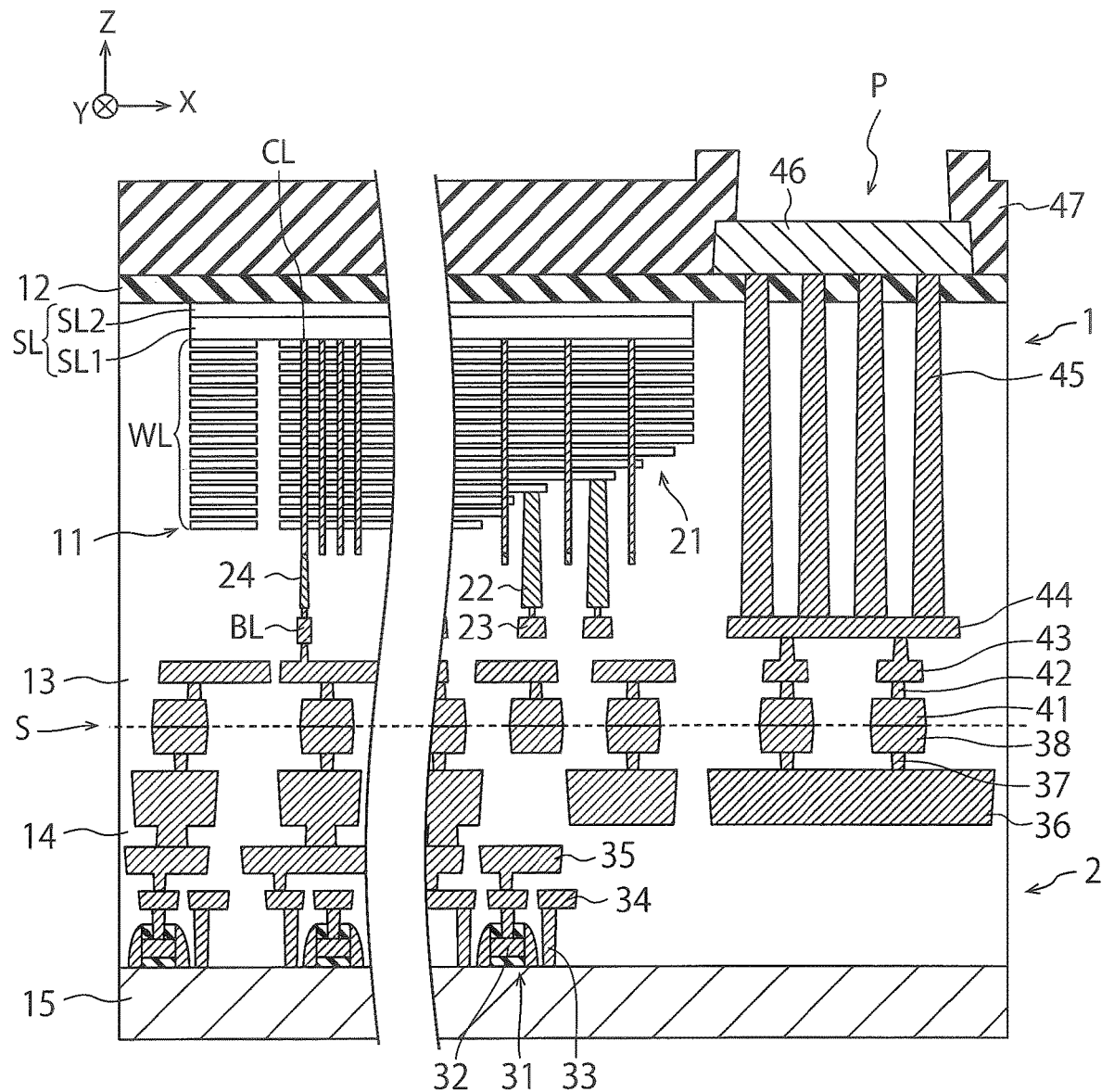
FIG. 1 is a sectional view illustrating a structure of a semiconductor device in a first embodiment.

In one embodiment, a semiconductor device includes a substrate, a lower pad provided above the substrate, and an upper pad provided on the lower pad. The lower pad includes a first pad and a plurality of first connection portions provided on the first pad, and the upper pad is provided on the plurality of first connection portions, or the upper pad includes a second pad and a plurality of second connection portions provided under the second pad, and the lower pad is provided under the plurality of second connection portions.

Embodiments will now be explained with reference to the accompanying drawings. In FIGS. 1 to 22B, the same reference numerals will be assigned to the same components, and overlapped description will be omitted.

First Embodiment

FIG. 1 is a sectional view illustrating a structure of a semiconductor device in a first embodiment. The semiconductor device in FIG. 1 is a three-dimensional memory in which an array chip 1 is bonded to a circuit chip 2.

The array chip 1 includes a memory cell array 11 including a plurality of memory cells, an insulator 12 on the memory cell array 11, and an inter layer dielectric 13 under the memory cell array 11. The insulator 12 is, for example, a silicon oxide film or a silicon nitride film. The inter layer dielectric 13 is, for example, a silicon oxide film or a stacked film including a silicon oxide film and other insulators.

The circuit chip 2 is provided under the array chip 1. A reference numeral "S" indicates a bonding face of the array chip 1 and the circuit chip 2. The circuit chip 2 includes an inter layer dielectric 14, and a substrate 15 under the inter layer dielectric 14. The inter layer dielectric 14 is, for example, a silicon oxide film or a stacked film including a silicon oxide film and other insulators. The substrate 15 is, for example, a semiconductor substrate such as a silicon substrate.

FIG. 1 indicates an X direction and a Y direction which are parallel to a surface of the substrate 15 and which are perpendicular to each other, and a Z direction perpendicular to the surface of the substrate 15. In the present specification, a +Z direction is handled as an upward direction, and a −Z direction is handled as a downward direction. The −Z direction may match a direction of gravitational force or does not have to match the direction of gravitational force.

The array chip 1 includes a plurality of word lines WL and a source line SL as an electrode layer inside the memory cell array 11. FIG. 1 illustrates a stepwise structure portion 21 of the memory cell array 11. Each word line WL is electrically connected to a word interconnect layer 23 via a contact plug 22. Each columnar portion CL which penetrates through the plurality of word lines WL is electrically connected to a bit line BL via a via plug 24, and is also electrically connected to the source line SL. The source line SL includes a first layer SL1 which is a semiconductor layer, and a second layer SL2 which is a metal layer.

The circuit chip 2 includes a plurality of transistors 31. Each transistor 31 includes a gate electrode 32 provided on the substrate 15 via a gate insulator, and a source diffusion layer and a drain diffusion layer which are provided inside the substrate 15 and which are not illustrated. Further, the circuit chip 2 includes a plurality of contact plugs 33 provided on the source diffusion layers or the drain diffusion layers of these transistors 31, an interconnect layer 34 which is provided on these contact plugs 33 and which includes a plurality of interconnects, and an interconnect layer 35 which is provided on the interconnect layer 34 and which includes a plurality of interconnects.

The circuit chip 2 further includes an interconnect layer 36 which is provided on the interconnect layer 35 and which includes a plurality of interconnects, a plurality of via plugs 37 which are provided on the interconnect layer 36, and a plurality of metal pads 38 which are provided on these via plugs 37. The metal pad 38 is, for example, a Cu (copper) layer or an Al (aluminum) layer. The metal pad 38 is an example of a lower pad. Details of the metal pad 38 will be described later. The circuit chip 2 functions as a control circuit (logic circuit) which controls operation of the array chip 1. This control circuit is configured with the transistors 31, or the like, and is electrically connected to the metal pad 38.

The array chip 1 includes a plurality of metal pads 41 provided on the metal pads 38, and a plurality of via plugs 42 provided on the metal pads 41. Further, the array chip 1 includes an interconnect layer 43 which is provided on these via plugs 42 and which includes a plurality of interconnects, and an interconnect layer 44 which is provided on the interconnect layer 43 and which includes a plurality of interconnects. The metal pad 41 is, for example, a Cu layer or an Al layer. The metal pad 41 is an example of an upper pad. Details of the metal pad 41 will be described later.

The array chip 1 further includes a plurality of via plugs 45 provided on the interconnect layer 44, a metal pad 46 provided on these via plugs 45 or on the insulator 12, and a passivation film 47 provided on the metal pad 46 or on the insulator 12. The metal pad 46 is, for example, a Cu layer or an Al layer, and functions as an external connection pad (bonding pad) of the semiconductor device in FIG. 1. The passivation film 47 is, for example, an insulator such as a silicon oxide film, and has an opening portion P which exposes an upper surface of the metal pad 46. The metal pad 46 can be connected to a mounting substrate or other devices through a bonding wire, a solder ball, a metal bump, or the like, via this opening portion P.

Figure 2:
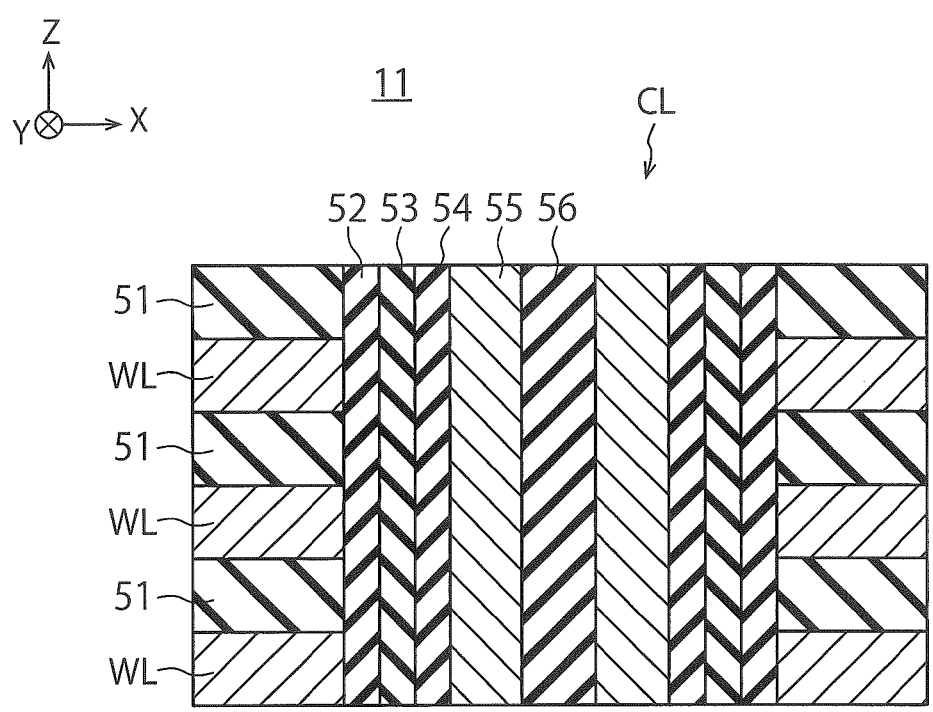
FIG. 2 is a sectional view illustrating a structure of a columnar portion in the first embodiment.

FIG. 2 is a sectional view illustrating a structure of a columnar portion CL in the first embodiment.

As illustrated in FIG. 2, the memory cell array 11 includes a plurality of word lines WL and a plurality of insulating layers 51 which are alternately stacked on the inter layer dielectric 13 (FIG. 1). The word line WL is, for example, a W (tungsten) layer. The insulating layer 51 is, for example, a silicon oxide film.

The columnar portion CL sequentially includes a block insulator 52, a charge accumulation layer 53, a tunnel insulator 54, a channel semiconductor layer 55, and a core insulator 56. The charge accumulation layer 53 is, for example, a silicon nitride film, and is formed on side surfaces of the word lines WL and the insulating layers 51 via the block insulator 52. The charge accumulation layer 53 may be a semiconductor layer such as a polysilicon layer. The channel semiconductor layer 55 is, for example, a polysilicon layer, and is formed on a side surface of the charge accumulation layer 53 via the tunnel insulator 54. The block insulator 52, the tunnel insulator 54, and the core insulator 56 are, for example, silicon oxide films or metal insulators.

Figure 3:
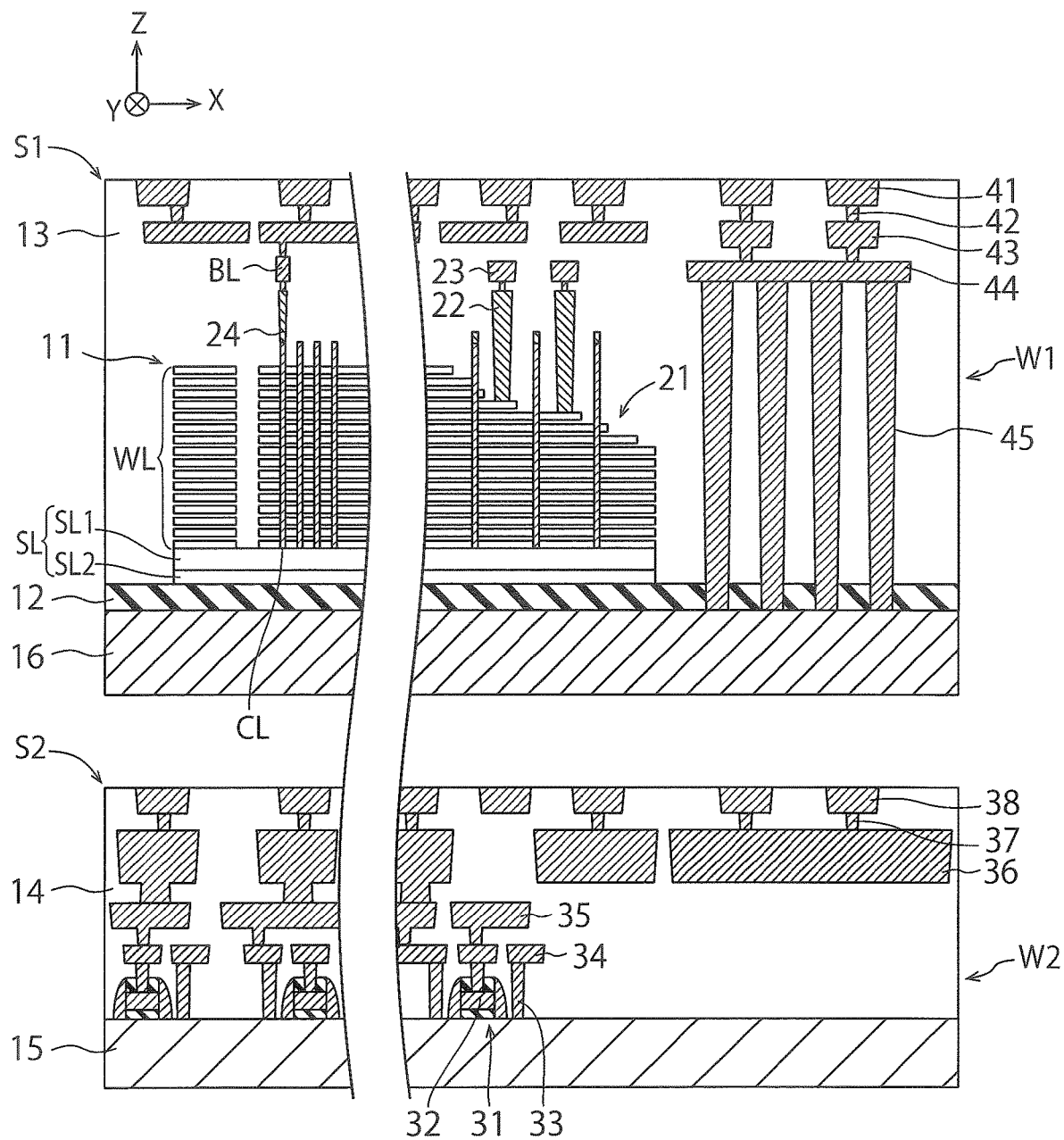
FIG. 3 is a sectional view illustrating a method of manufacturing the semiconductor device in the first embodiment.

FIG. 3 is a sectional view illustrating a method of manufacturing the semiconductor device in the first embodiment. FIG. 3 illustrates an array wafer W1 including a plurality of array chips 1, and a circuit wafer W2 including a plurality of circuit chips 2. The array wafer W1 is also called a memory wafer, and the circuit wafer W2 is also called a CMOS wafer.

It should be noted that a direction of the memory wafer W1 in FIG. 3 is opposite to a direction of the memory chip 1 in FIG. 1. In the present embodiment, the semiconductor device is manufactured by bonding the array wafer W1 to the circuit wafer W2. FIG. 3 illustrates the memory wafer W1 before the direction is inverted for bonding, and FIG. 1 illustrates the memory chip 1 after the direction is inverted for bonding, and bonding and singulation are performed.

In FIG. 3, a reference numeral 51 indicates an upper surface of the memory wafer W1, and a reference numeral S2 indicates an upper surface of the circuit wafer W2. Note that the memory wafer W1 includes a substrate 16 provided under the insulator 12. The substrate 16 is, for example, a semiconductor substrate such as a silicon substrate. The substrate 15 is an example of a first substrate, and the substrate 16 is an example of a second substrate.

In the present embodiment, first, as illustrated in FIG. 3, the memory cell array 11, the insulator 12, the inter layer dielectric 13, the stepwise structure portion 21, the metal pads 41, or the like, are formed on the substrate 16 of the memory wafer W1, and the inter layer dielectric 14, the transistors 31, the metal pads 38, or the like, are formed on the substrate 15 of the circuit wafer W2. For example, the via plugs 45, the interconnect layer 44, the interconnect layer 43, the via plugs 42 and the metal pads 41 are sequentially formed on the substrate 16. Further, the contact plugs 33, the interconnect layer 34, the interconnect layer 35, the interconnect layer 36, the via plugs 37 and the metal pads 38 are sequentially formed on the substrate 15. Then, the array wafer W1 is bonded to the circuit wafer W2 by a mechanical pressure. By this means, the inter layer dielectric 13 adheres to the inter layer dielectric 14. Then, the array wafer W1 and the circuit wafer W2 are annealed at 400° C. By this means, the metal pads 41 are joined to the metal pads 38.

Then, after the substrate 15 is made thinner through CMP (Chemical Mechanical Polishing), and the substrate 16 is removed through CMP, the array wafer W1 and the circuit wafer W2 are cut into a plurality of chips. The semiconductor device in FIG. 1 is manufactured in this manner. FIG. 1 illustrates the circuit chip 1 including the metal pads 38, and the array chip 1 including the metal pads 41 arranged on the metal pads 38. The metal pad 46 and the passivation film 47 are, for example, formed on the insulator 12 after the substrate 15 is made thinner and the substrate 16 is removed.

While, in the present embodiment, the array wafer W1 is bonded to the circuit wafer W2, the array wafers W1 may be bonded to each other instead. Content described above with reference to FIGS. 1 to 3 and content which will be described later with reference to FIGS. 4 to 22 can be also applied to bonding between the array wafers W1.

Further, while FIG. 1 illustrates a boundary surface between the inter layer dielectric 13 and the inter layer dielectric 14, and a boundary surface between the metal pads 41 and the metal pads 38, typically, these boundary surfaces cannot be observed after the above-described annealing. However, positions of these boundary surfaces can be estimated by, for example, detecting inclination of the side surfaces of the metal pads 41 and side surfaces of the metal pads 38, and misalignment between the side surfaces of the metal pads 41 and the metal pads 38.

Figure 4A:
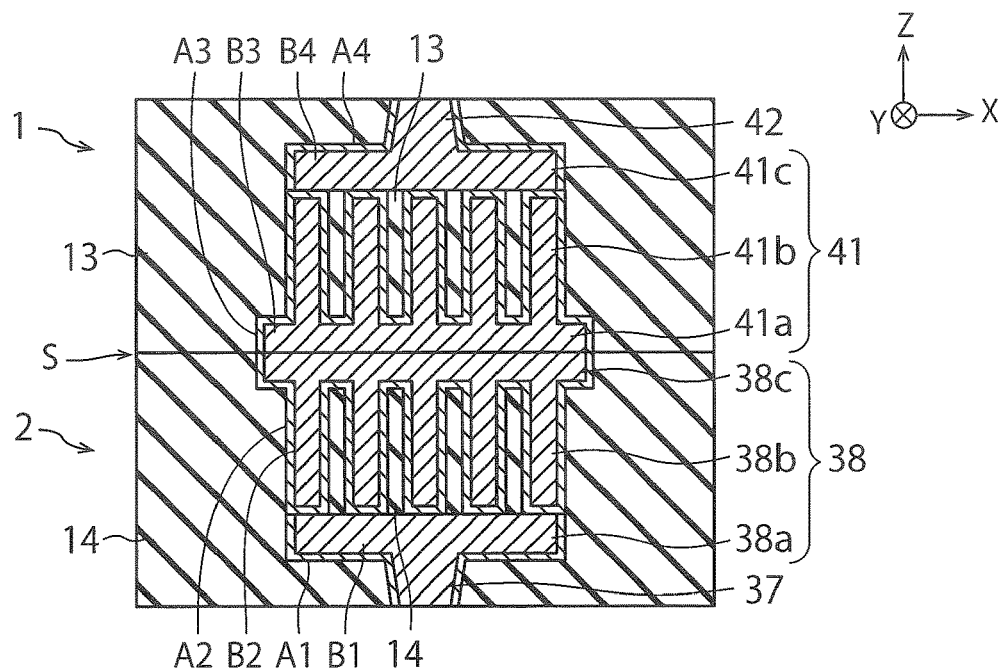
FIGS. 4A to 4C are a sectional view and perspective views illustrating structures of a metal pad, or the like, in the first embodiment.
Figure 4B:
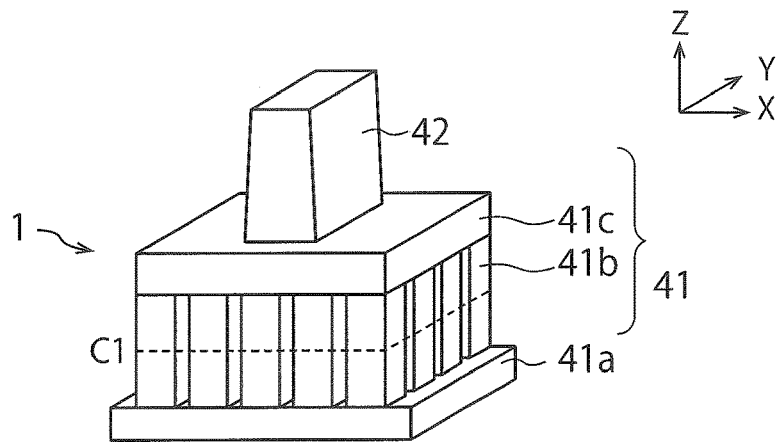
Figure 4C:
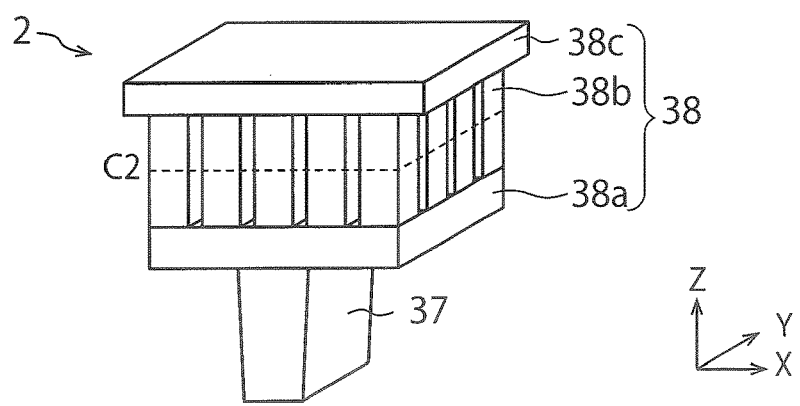

FIGS. 4A to 4C are a sectional view and perspective views illustrating structures of the metal pads 38, 41, or the like, in the first embodiment.

FIG. 4A is a sectional view illustrating a pair of the metal pads 38 and 41 which are electrically connected to each other. FIG. 4B is a perspective view illustrating the metal pad 41 in FIG. 4A. FIG. 4C is a perspective view illustrating the metal pad 38 in FIG. 4A. The metal pad 38 is an example of a lower pad, and the metal pad 41 is an example of an upper pad.

Structures of the metal pads 38, 41, or the like, will be described below with reference to FIG. 4A. The description will be provided also with reference to FIGS. 4B and 4C as appropriate.

The metal pad 38 includes a first lower pad 38a provided on the via plug 37, a plurality of lower connection portions 38b provided on the first lower pad 38a, and a second lower pad 38c provided on these lower connection portions 38b. The metal pad 41 is provided on the second lower pad 38c. The first lower pad 38a, the lower connection portion 38b and the second lower pad 38c are respectively examples of a first pad, a first connection portion and a third pad.

The metal pad 41 includes a first upper pad 41a provided on the second lower pad 38c, a plurality of upper connection portions 41b provided on the first upper pad 41a, and a second upper pad 41c provided on these upper connection portions 41b. The via plug 42 is provided on the second upper pad 41c. The first upper pad 41a, the upper connection portion 41b and the second upper pad 41c are respectively examples of a fourth pad, a second connection portion and a second pad.

In the present embodiment, the via plug 37 and the first lower pad 38a are formed at the same time, and the lower connection portions 38b and the second lower pad 38c are formed at the same time. The via plug 37 and the first lower pad 38a sequentially include a barrier metal layer A1 and an interconnect material layer B1, and the lower connection portions 38b and the second lower pad 38c sequentially include a barrier metal layer A2 and an interconnect material layer B2. Therefore, the first lower pad 38a is provided on the via plug 37 via no barrier metal layer, the lower connection portions 38b are provided on the first lower pad 38a via the barrier metal layer A2, and the second lower pad 38c is provided on the lower connection portions 38b via no barrier metal layer. The barrier metal layers A1 and A2 are, for example, a Ti (titanium) containing layer or a Ta (tantalum) containing layer. The interconnect material layers B1 and B2 are, for example, Cu layers.

In the present embodiment, further, the via plug 42 and the second upper pad 41c are formed at the same time, and the upper connection portions 41b and the first upper pad 41a are formed at the same time. The via plug 42 and the second upper pad 41c sequentially include a barrier metal layer A4 and an interconnect material layer B4, and the upper connection portion 41b and the first upper pad 41a sequentially include a barrier metal layer A3 and an interconnect material layer B3. Therefore, the second upper pad 41c is provided under the via plug 42 via no barrier metal layer, the upper connection portions 41b are provided under the second upper pad 41c via the barrier metal layer A3, and the first lower pad 41a is provided under the upper connection portions 41b via no barrier metal layer. The barrier metal layers A3 and A4 are, for example, Ti containing layers or Ta containing layers. The interconnect material layers B3 and B4 are, for example, Cu layers.

As described above, the metal pad 38 in the present embodiment includes the first lower pad 38a and the second lower pad 38c which are electrically connected with a plurality of lower connection portions 38b. These lower connection portions 38b are separated from each other by the inter layer dielectric 14. While FIG. 4C illustrates the lower connection portions 38b of 5×4 arranged in a quadrangle grid shape, the number and arrangement of the lower connection portions 38b are not limited to these.

In a similar manner, the metal pad 41 in the present embodiment includes the first upper pad 41a and the second upper pad 41c which are electrically connected with a plurality of upper connection portions 41b. These upper connection portions 41b are separated from each other by the inter layer dielectric 13. While FIG. 4B illustrates the upper connection portions 41b of 5×4 arranged in a quadrangle grid shape, the number and arrangement of the upper connection portions 41b are not limited to these.

While, in a pair of the metal pads 38 and 41 in the present embodiment, the number of the upper connection portions 41b is the same as the number of the lower connection portions 38b, the number of the upper connection portions 41b may be different from the number of the lower connection portions 38b. Further, while, in a pair of the metal pads 38 and 41 in the present embodiment, the arrangement of the upper connection portions 41b is the same as the arrangement of the lower connection portions 38b, the arrangement of the upper connection portions 41b may be different from the arrangement of the lower connection portions 38b.

Figure 5A:
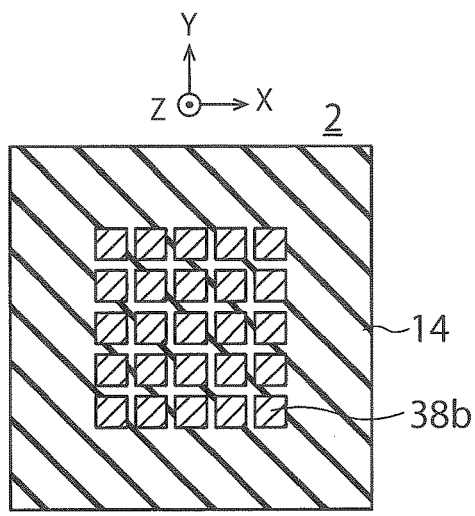
FIGS. 5A to 5C are sectional views illustrating structures of the metal pad, or the like, in the first embodiment.
Figure 5B:
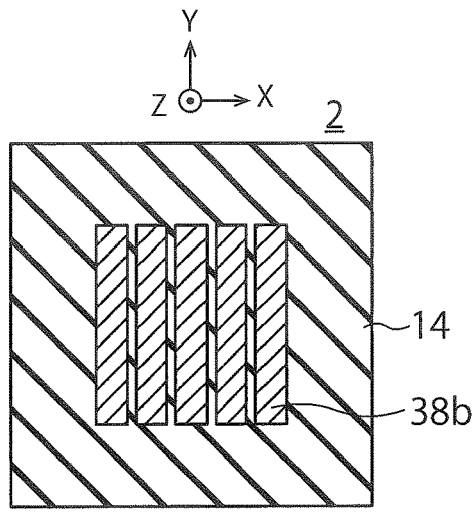
Figure 5C:
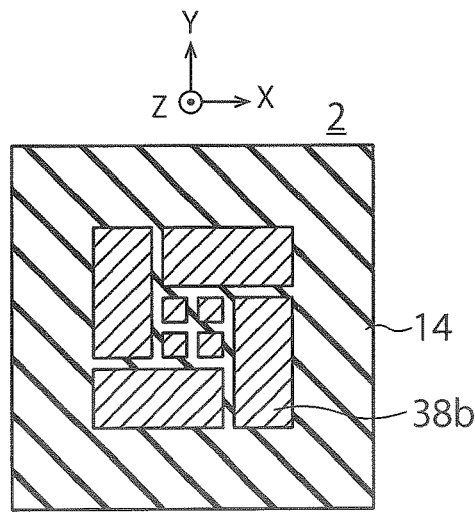

FIGS. 5A to 5C are sectional views illustrating structures of the metal pad 38, or the like, in the first embodiment.

FIGS. 5A, 5B and 5C respectively illustrate first, second and third examples of a shape of the lower connection portions 38b on a cross-section C2 in FIG. 4C. The lower connection portions 38b in FIG. 5A are arranged in a two-dimensional array shape. The lower connection portions 38b in FIG. 5B are arranged in a one-dimensional array shape, are adjacent to each other in the X direction, and extend in the Y direction. The lower connection portions 38b in FIG. 5C include small lower connection portions 38b and large lower connection portions 38b. The metal pad 38 in the present embodiment may include any shape of lower connection portions 38b.

A shape of the upper connection portions 41b on a cross-section C1 in FIG. 4B can be set in shapes similar to those in these examples.

Figure 6A:
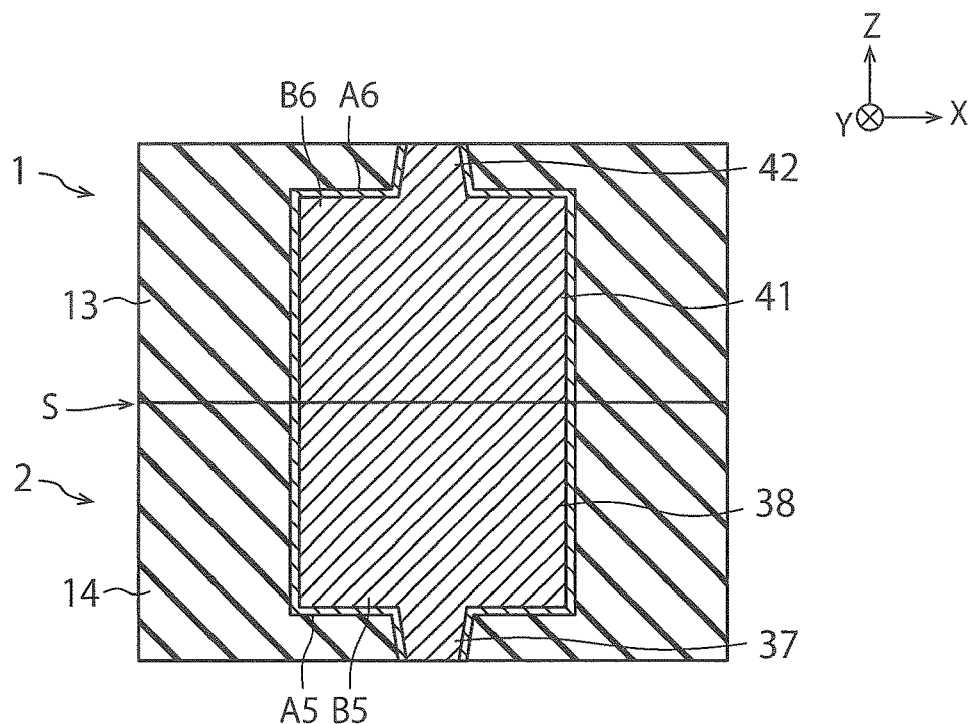
FIGS. 6A to 6C are a sectional view and perspective views illustrating structures of a metal pad, or the like, in a comparative example of the first embodiment.
Figure 6B:
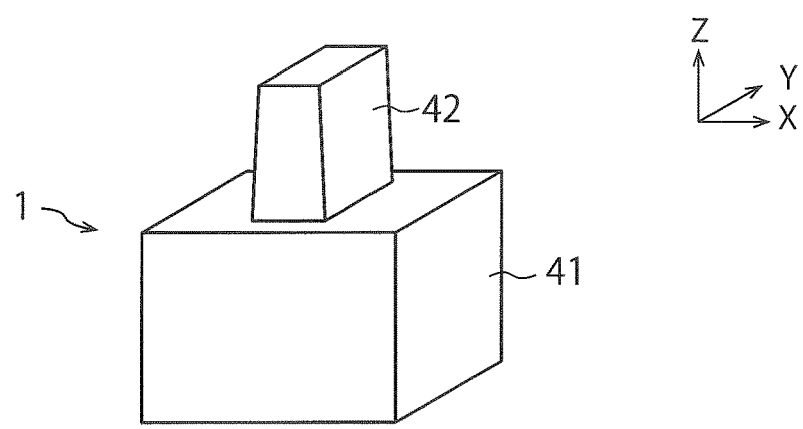
Figure 6C:
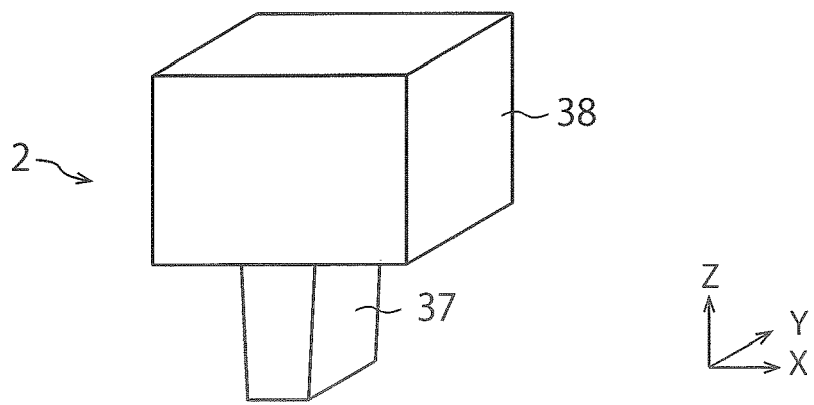

FIGS. 6A to 6C are a sectional view and perspective views illustrating structures of metal pads 38, 41, or the like, in a comparative example of the first embodiment.

FIG. 6A is a sectional view illustrating a pair of metal pads 38 and 41 which are electrically connected to each other. FIG. 6B is a perspective view illustrating the metal pad 41 in FIG. 6A. FIG. 6C is a perspective view illustrating the metal pad 38 in FIG. 6A.

The metal pad 38 in this comparative example is formed with a single pad. Further, the metal pad 41 in this comparative example is also formed with a single pad. In this comparative example, the via plug 37 and the metal pad 38 sequentially include a barrier metal layer A5 and an interconnect material layer B5, and the via plug 42 and the metal pad 41 sequentially include a barrier metal layer A6 and an interconnect material layer B6. The barrier metal layers A5 and A6 are, for example, Ti containing layers or Ta containing layers. The interconnect material layers B5 and B6 are, for example, Cu layers.

Figure 7A:
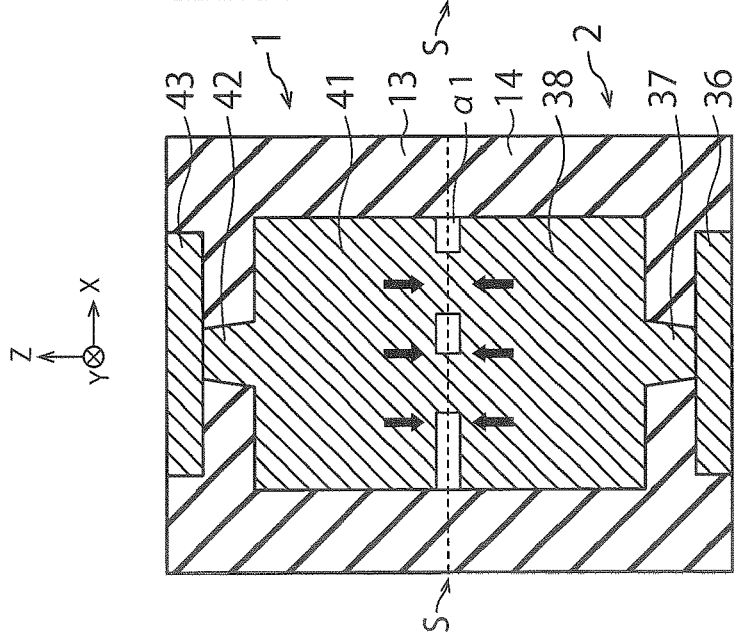
FIGS. 7A to 7C are sectional views for explaining a problem of the metal pad, or the like, in the comparative example of the first embodiment.
Figure 7B:
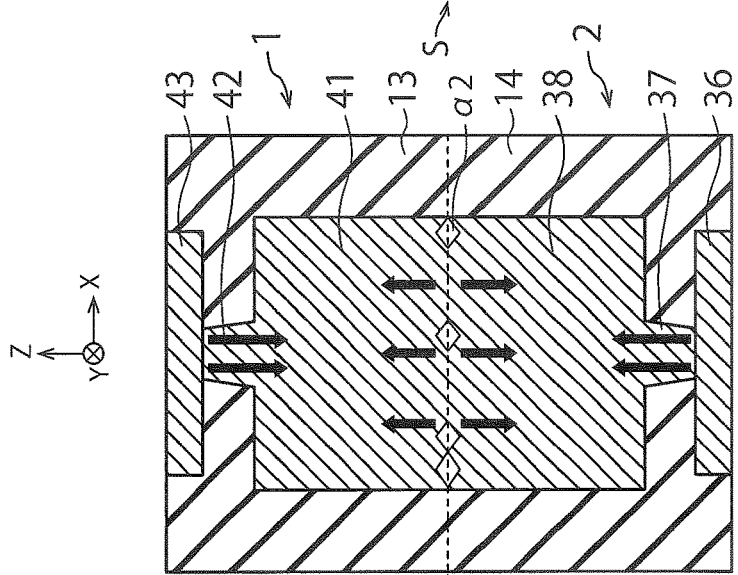
Figure 7C:
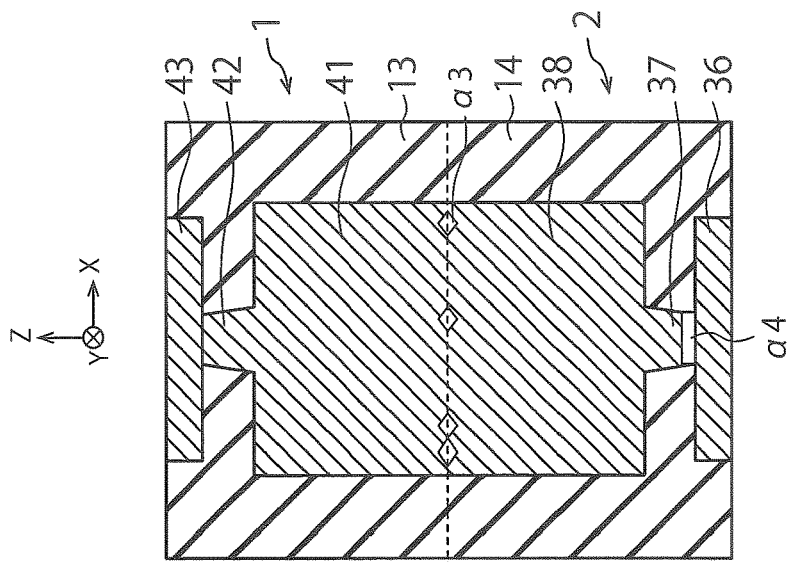

FIGS. 7A to 7C are sectional views for explaining problems of the metal pads 38, 41, or the like, in the comparative example of the first embodiment.

FIG. 7A illustrates the metal pads 38 and 41 while annealing described with reference to FIG. 3 is performed. When the metal pads 38 and 41 are annealed, there is a possibility that the metal pads 38 and 41 may thermally expand, and a void may be generated on the bonding face S of the metal pads 38 and 41 (reference numeral "α1").

FIG. 7B illustrates the metal pads 38 and 41 which are being cooled after annealing is performed. When the metal pads 38 and 41 are cooled after annealing, the metal pads 38 and 41 thermally contract, and tensile stress acts on the metal pads 38 and 41 and the via plugs 37 and 42. A reference numeral "α2" indicates a void whose shape changes from the state indicated with a reference numeral "α1".

FIG. 7C illustrates the metal pads 38 and 41 after cooling is finished. A reference numeral "α3" indicates a void whose shape changes from the state indicated with the reference numeral "α2". In a case where the above-described tensile stress is large, there is a possibility that more voids may be generated inside the metal pads 38 and 41 and inside the via plugs 37 and 42 due to the tensile stress. A reference numeral "α4" indicates a void generated at the via plug 37. Because, typically, the via plug 37 is thin, if a void is generated at the via plug 37, there is a possibility that a contact defect may occur at the via plug 37 or resistance of the via plug 37 becomes excessively high. This also applies to a case where a void is generated at the via plug 42.

FIGS. 8A to 8C are sectional views for explaining advantages of the metal pads 38, 41, or the like, in the first embodiment.

FIG. 8A illustrates the metal pads 38 and 41 while annealing described with reference to FIG. 3 is being performed. When the metal pads 38 and 41 are annealed, there is a possibility that the metal pads 38 and 41 may thermally expand, and a void may be generated on the bonding face S of the metal pads 38 and 41 (reference numeral "β1").

FIG. 8B illustrates the metal pads 38 and 41 while cooling is being performed after annealing is performed. When the metal pads 38 and 41 are cooled after annealing, the metal pads 38 and 41 thermally contract, and tensile stress acts on the metal pads 38 and 41 and the via plugs 37 and 42. A reference numeral "β2" indicates a void whose shape changes from the state indicated with the reference numeral "β1".

FIG. 8C illustrates the metal pads 38 and 41 after cooling is finished. A reference numeral "β3" indicates a void whose shape changes from the state indicated with the reference numeral "β2". In a case where the above-described tensile stress is large, there is a possibility that more voids may be generated inside the metal pads 38 and 41 and inside the via plugs 37 and 42 due to the tensile stress. A reference numeral "β4" indicates a void generated at the lower connection portion 38b. Because the metal pad 38 in the present embodiment includes a plurality of lower connection portions 38b, even if a void is generated at one lower connection portion 38b, if voids are not generated at other lower connection portions 38b, it is possible to prevent occurrence of a contact defect at the entire metal pad 38, or prevent excessive high resistance of the entire metal pad 38. This also applies to a case where a void is generated at the upper connection portion 41b of the metal pad 41.

Further, in a case where a void is generated at the lower connection portion 38b, the barrier metal layer A2 on the lower surface of the lower connection portion 38b functions as a gettering site. That is, a void indicated with the reference numeral "β4" does not move even if a current is applied. By this means, it is possible to prevent this void from moving to the via plug 37 and causing a contact defect or high resistance of the via plug 37. This also applies to a case where a void is generated at the upper connection portion 41b of the metal pad 41.

In this manner, according to the present embodiment, it is possible to reduce defects of the metal pads 38 and 41 and the via plugs 37 and 42 due to a void, so that it is possible to improve a yield of the semiconductor device.

FIGS. 9A to 11C are cross-section diagrams and a perspective view illustrating a method of manufacturing the semiconductor device in the first embodiment. Here, process of forming the metal pad 38, or the like, above the substrate 15 for the circuit wafer W2 will be described. This description can be also applied to process of forming the metal pad 41, or the like, above the substrate 16 for the array wafer W1.

Figure 9A:
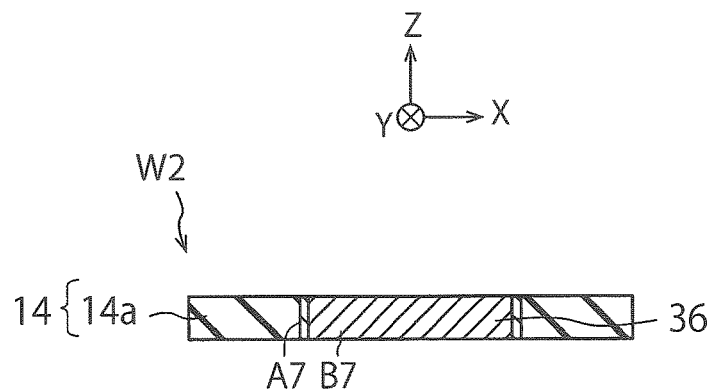
FIGS. 9A to 11C are sectional views and a perspective view illustrating a method of manufacturing the semiconductor device in the first embodiment.

First, the interconnect layer 36 is formed above the substrate 15 (see FIGS. 1 and 3) (FIG. 9A). FIG. 9A illustrates the interconnect layer 36 formed inside the insulator 14a which constitutes the inter layer dielectric 14. The insulator 14a is, for example, an $SiO_2$ film (silicon oxide film). The interconnect layer 36 sequentially includes a barrier metal layer A7 and an interconnect material layer B7 sequentially formed above the substrate 15. The barrier metal layer A7 is, for example, a Ti containing layer or a Ta containing layer. The interconnect material layer B7 is, for example, a Cu layer.

Figure 9B:
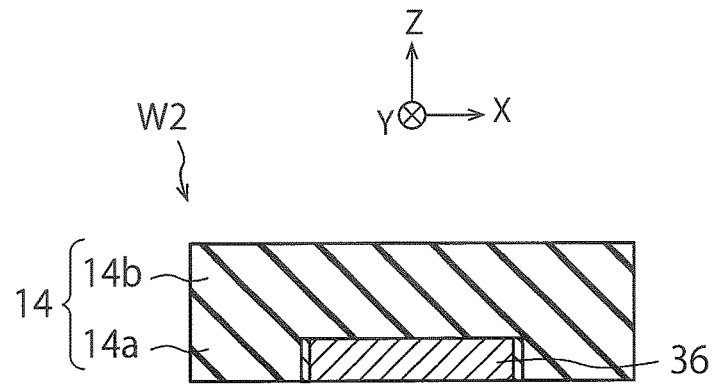
Figure 9C:
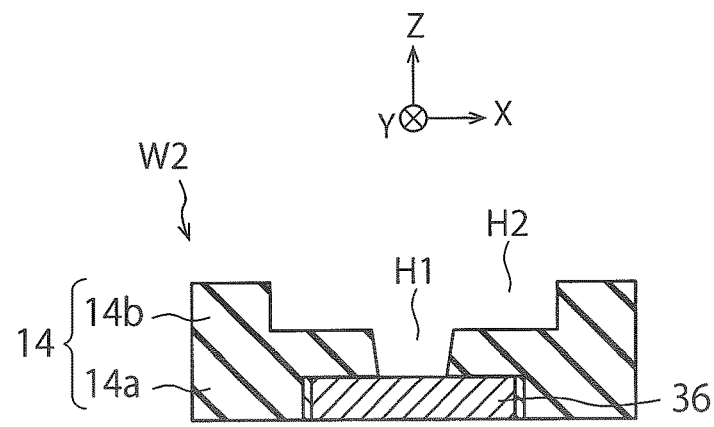
Figure 10A:
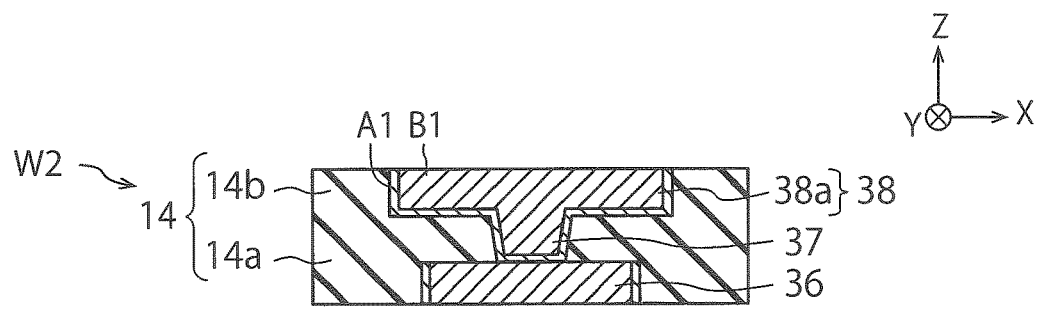

Then, an insulator 14b constituting the inter layer dielectric 14 is formed on the interconnect layer 36 and the insulator 14a (FIG. 9B). The insulator 14b is, for example, an $SiO_2$ film. Then, an opening portion H1 for the via plug 37 and an opening portion H2 for the first lower pad 38a are formed at this insulator 14b (FIG. 9C). Then, the barrier metal layer A1 and the interconnect material layer B1 are sequentially formed inside the opening portions H1 and H2 (FIG. 10A). As a result, the via plug 37 is formed on the interconnect layer 36 inside the opening portion H1, and the first lower pad 38a is formed on the via plug 37 inside the opening portion H2.

Figure 10B:
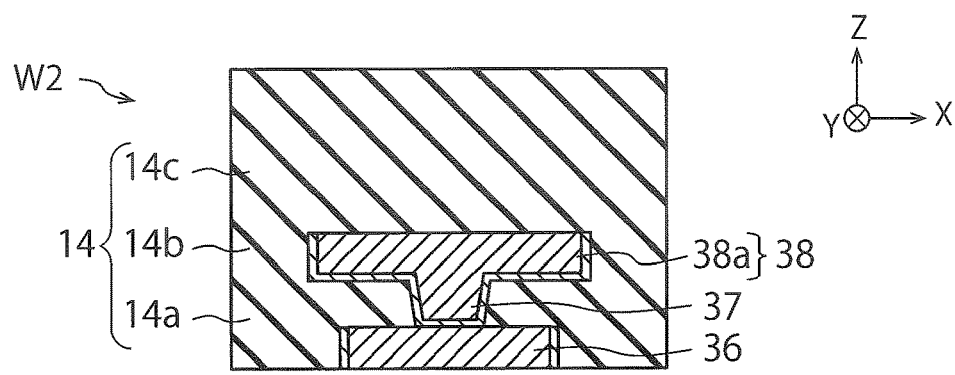
Figure 10C:
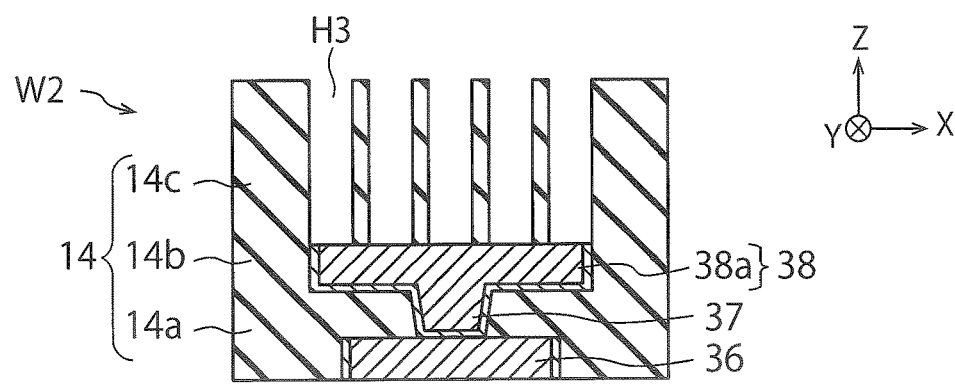
Figure 11A:
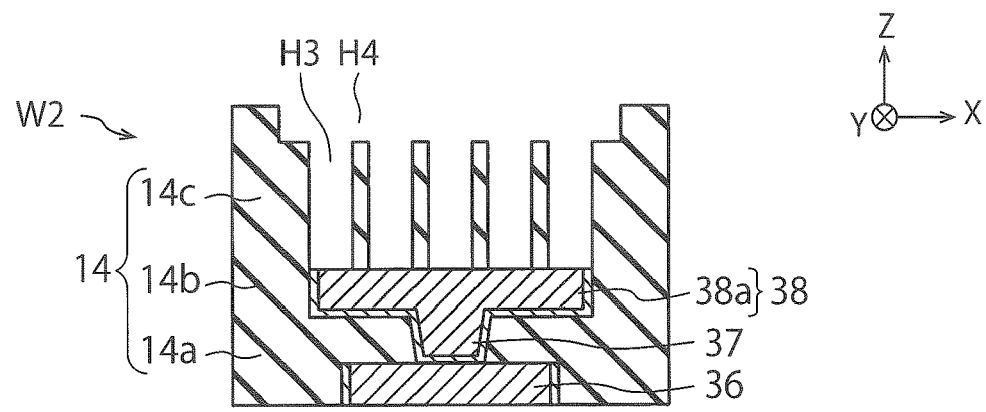
Figure 11B:
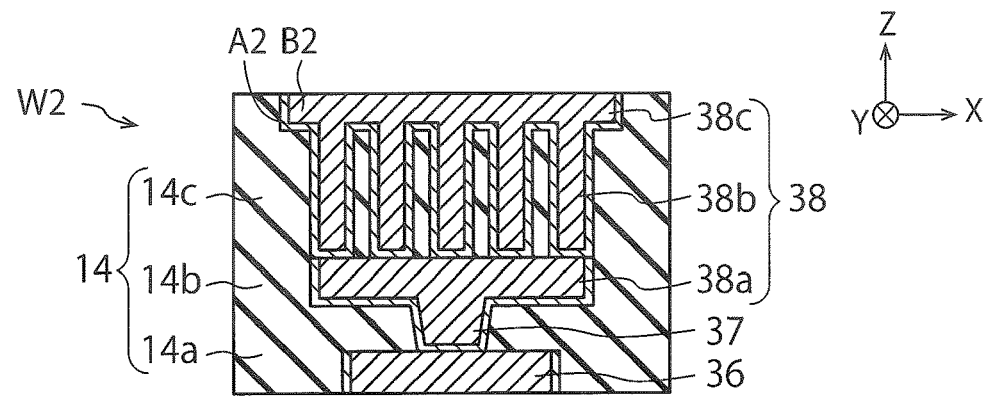
Figure 11C:
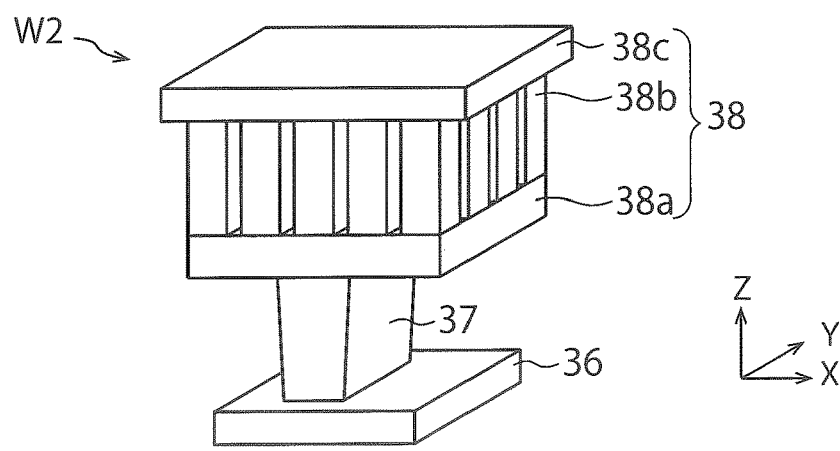

Then, the insulator 14c constituting the inter layer dielectric 14 is formed on the first lower pad 38a and the insulator 14b (FIG. 10B). The insulator 14c is, for example, an $SiO_2$ film. Then, a plurality of opening portions H3 for the lower connection portions 38b and an opening portion H4 for the second lower pad 38c are formed at this insulator 14c (FIGS. 10C and 11A). Then, the barrier metal layer A2 and the interconnect material layer B2 are sequentially formed inside the opening portions H3 and H4 (FIG. 11B). As a result, the lower connection portions 38b are formed on the first lower pad 38a inside the opening portions H3, and the second lower pad 38c is formed on the lower connection portions 38b inside the opening portion H4. FIG. 11C is a perspective view corresponding to FIG. 11B.

In this manner, the interconnect layer 36, the via plug 37 and the metal pad 38 are formed above the substrate 15 for the circuit wafer W2. In a similar manner, the interconnect layer 43, the via plug 42 and the metal pad 41 are formed above the substrate 16 for the array wafer W1. The second upper pad 41c, the upper connection portions 41b and the first upper pad 41a of the metal pad 41 can be respectively formed in a similar manner to the first lower pad 38a, the lower connection portions 38b and the second lower pad 38c of the metal pad 38. Further, the barrier metal layer A4, the interconnect material layer B4, the barrier metal layer A3 and the interconnect material layer B3 can be respectively formed in a similar manner to the barrier metal layer A1, the interconnect material layer B1, the barrier metal layer A2 and the interconnect material layer B2. The semiconductor device in FIG. 1 is manufactured by the method in FIG. 3 being executed thereafter.

Figure 12A:
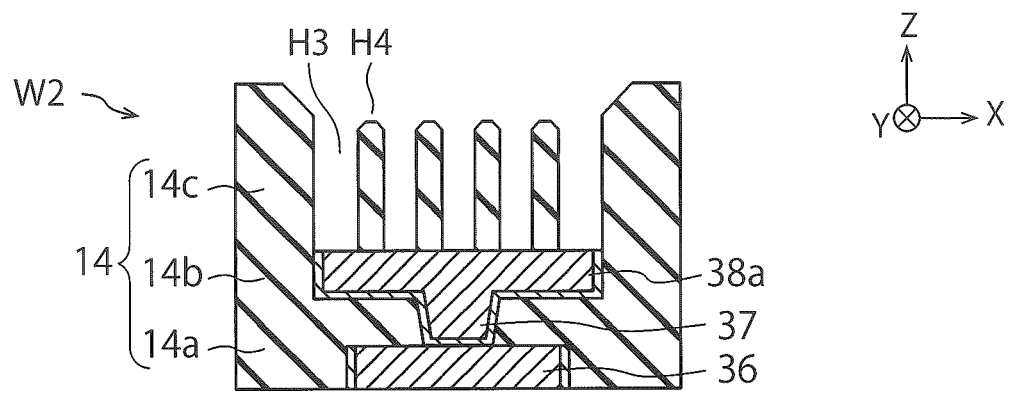
FIGS. 12A and 12B are sectional views illustrating a method of manufacturing a semiconductor device in a first modified example of the first embodiment.
Figure 12B:
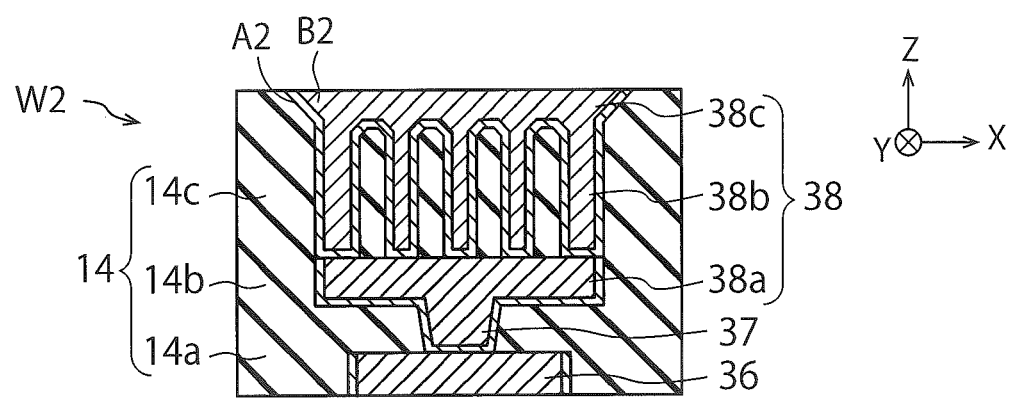

FIGS. 12A and 12B are sectional views illustrating a method of manufacturing a semiconductor device in a first modified example of the first embodiment.

FIG. 12A is a sectional view illustrating process between FIG. 11A and FIG. 11B. After the opening portions H3 and H4 are formed, the opening portions H3 and H4 may be processed by isotropic etching. As a result, side surfaces of the opening portions H3 and H4 are processed in a tapered shape (FIG. 12A). Instead of process in FIG. 12A being added, process in FIG. 11A may be implemented so that the side surfaces of the opening portions H3 and H4 are made in a tapered shape.

Then, the barrier metal layer A2 and the interconnect material layer B2 are sequentially formed inside the opening portions H3 and H4 (FIG. 12B). As a result, the lower connection portions 38b are formed on the first lower pad 38a inside the opening portion H3, and the second lower pad 38c is formed on the lower connection portions 38b inside the opening portion H4. The semiconductor device in FIG. 1 is manufactured by the method in FIG. 3 being executed thereafter.

Figure 13A:
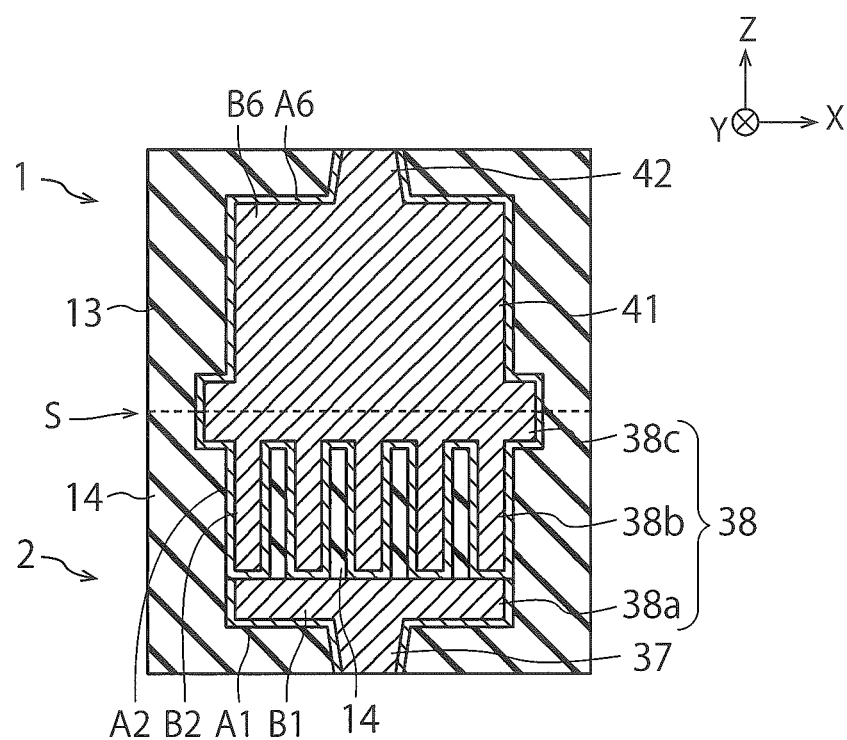
FIGS. 13A and 13B are sectional views illustrating structures of a metal pad, or the like, in second and third modified examples of the first embodiment.
Figure 13B:
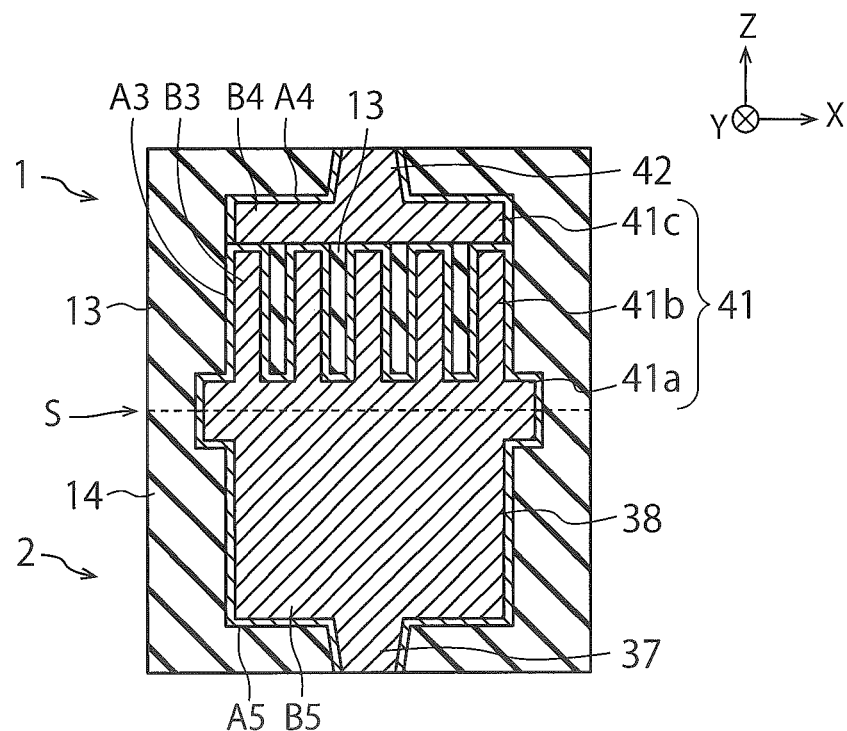

FIGS. 13A and 13B are sectional views illustrating structures of metal pads 38, 41, or the like, in second and third modified examples of the first embodiment.

FIG. 13A illustrates the metal pads 38 and 41 in the second modified example. The metal pad 38 in the present modified example has the same structure as the structure of the metal pad 38 (FIG. 4A) in the first embodiment. Meanwhile, the metal pad 41 in the present modified example has the same structure as the structure of the metal pad 41 (FIG. 6A) in the comparative example of the first embodiment. By this means, it is possible to reduce defects of the metal pad 38 and the via plug 37 of the metal pad 38 due to a void, so that it is possible to improve a yield of the semiconductor device.

Meanwhile, FIG. 13B illustrates the metal pads 38 and 41 in the third modified example. The metal pad 38 in the present modified example has the same structure as the structure of the metal pad 38 (FIG. 6A) in the comparative example of the first embodiment. Meanwhile, the metal pad 41 in the present modified example has the same structure as the structure of the metal pad 41 (FIG. 4A) in the first embodiment. By this means, it is possible to reduce defects of the metal pad 41 and the via plug 42 of the metal pad 41 due to a void, so that it is possible to improve a yield of the semiconductor device.

The metal pad 41 in FIG. 13A and the metal pad 38 in FIG. 13B can be formed by process from FIGS. 10B to 11C being omitted from process from FIGS. 9A to 11C. However, in this case, a film thickness of the insulator 14b is made thicker, and a depth of the opening portion H2 is made deeper.

FIGS. 14A to 16B are sectional views and a perspective view illustrating a method of manufacturing a semiconductor device in a fourth modified example of the first embodiment. Here, process of forming the metal pad 38, or the like, above the substrate 15 for the circuit wafer W2 will be described. This description can be also applied to process of forming the metal pad 41, or the like, above the substrate 16 for the array wafer W1.

Figure 14A:
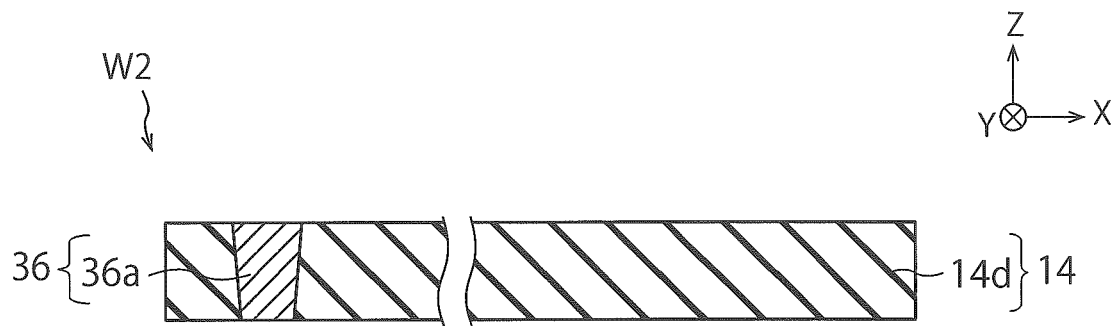
FIGS. 14A to 16B are sectional views and a perspective view illustrating a method of manufacturing a semiconductor device in a fourth modified example of the first embodiment.

First, the via plug 36a constituting the interconnect layer 36 is formed above the substrate 15 (see FIGS. 1 and 3) (FIG. 14A). FIG. 14A illustrates the via plug 36a formed inside the insulator 14d constituting the inter layer dielectric 14. The insulator 14d is, for example, an SiO$_2$ film.

Figure 14B:
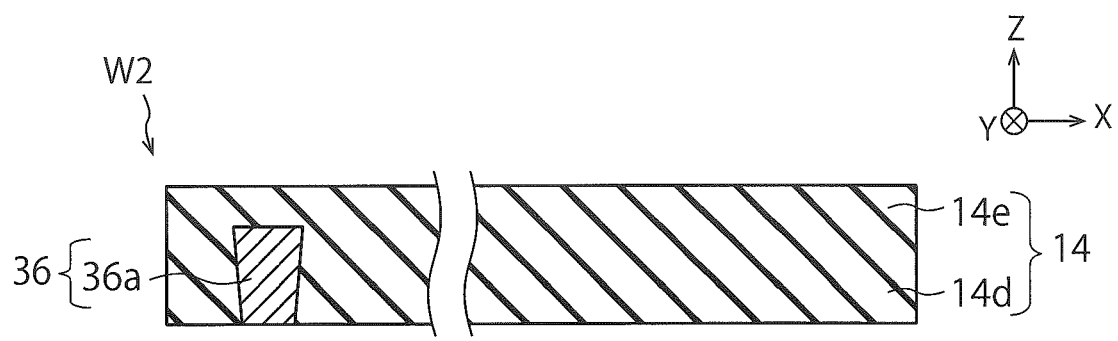
Figure 14C:
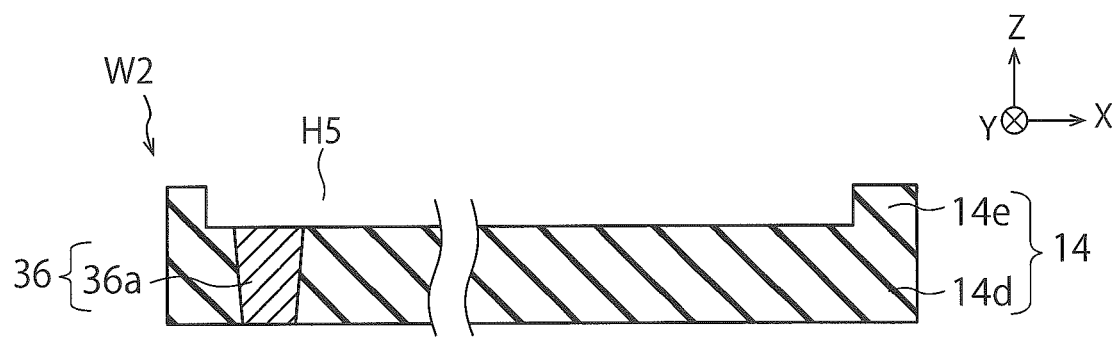
Figure 15A:
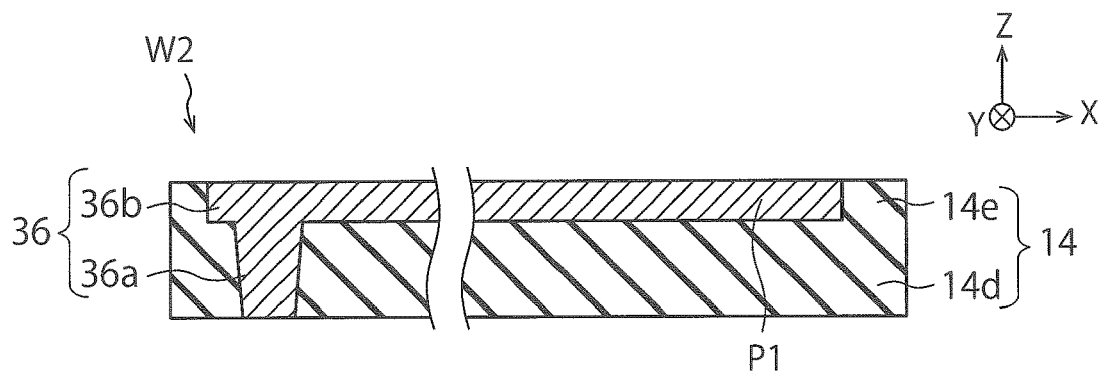

Then, an insulator 14e constituting the inter layer dielectric 14 is formed on the via plug 36a and the insulator 14d (FIG. 14B). The insulator 14e is, for example, an SiO$_2$ film. Then, an interconnect 36b constituting the interconnect layer 36 and an opening portion H5 for the first lower pad P1 are formed at this insulator 14e (FIG. 14C). Then, the interconnect 36b and the first lower pad P1 are formed inside the opening portion H5 (FIG. 15A). As a result, the interconnect 36b is formed on the via plug 36a inside the opening portion H5, and, further, the first lower pad P1 which is electrically connected to the interconnect 36b is formed inside the opening portion H5.

Figure 15B:
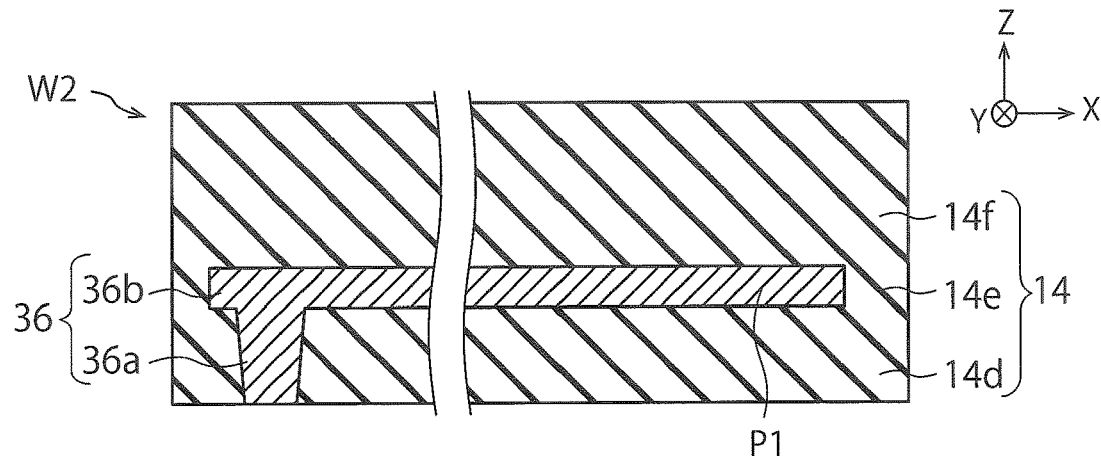
Figure 15C:
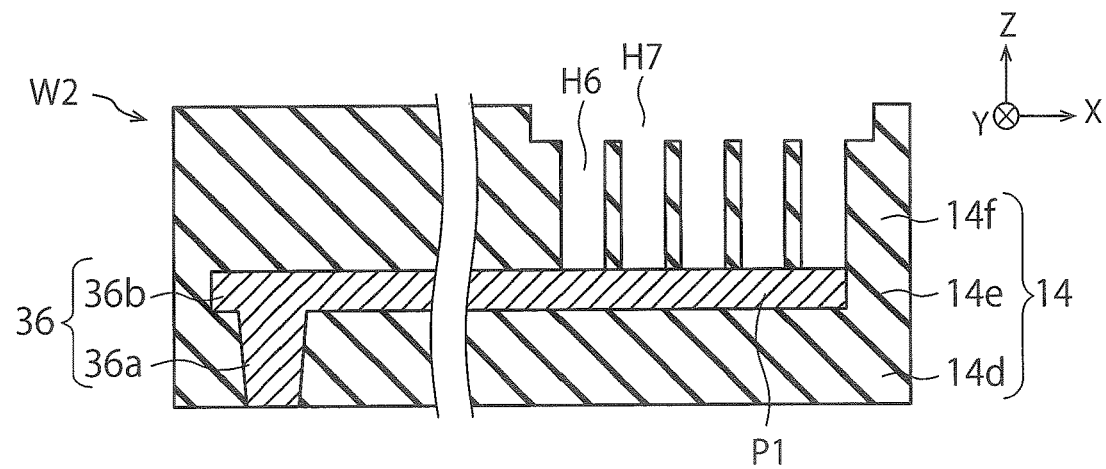
Figure 16A:
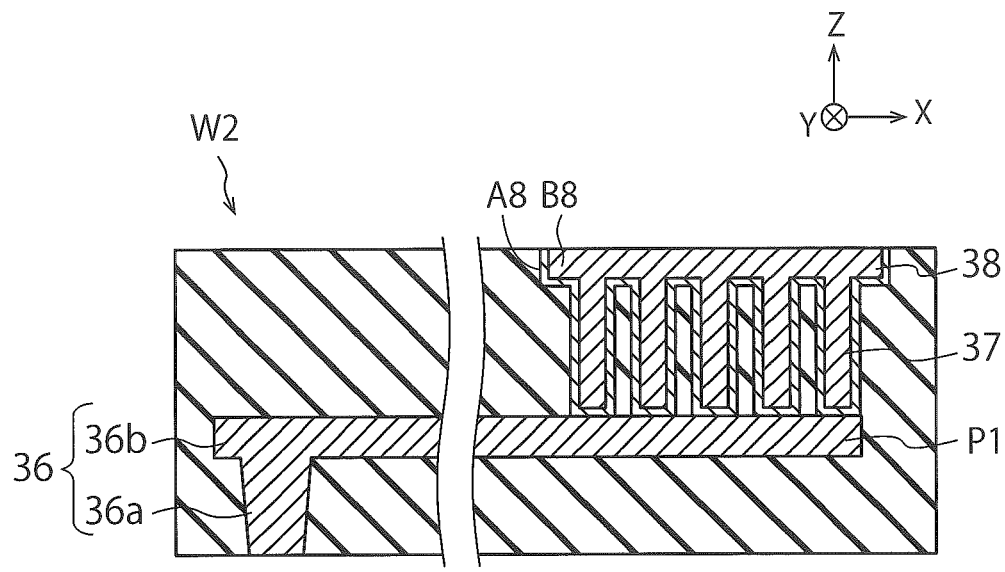
Figure 16B:
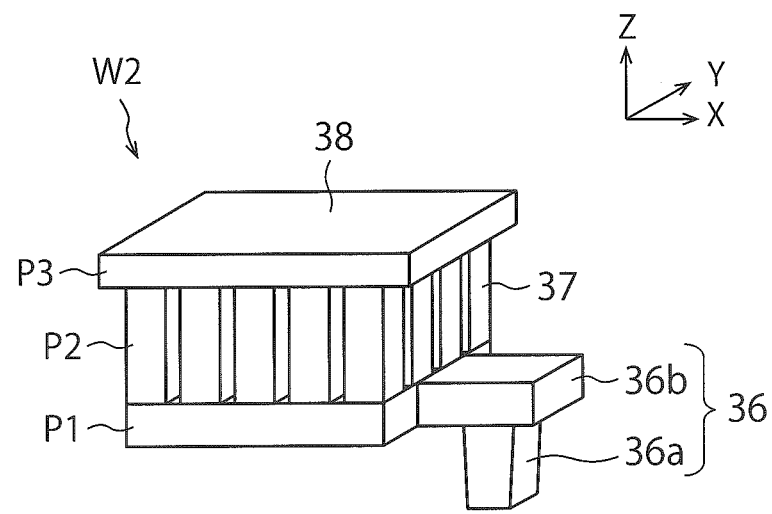

Then, an insulator 14f constituting the inter layer dielectric 14 is formed on the interconnect 36b, the first lower pad P1 and the insulator 14e (FIG. 15B). The insulator 14f is, for example, an SiO$_2$ film. Then, a plurality of opening portions H6 for a plurality of via plugs 37 and an opening portion H7 for the metal pad 38 are formed at this insulator 14f (FIG. 15C). Then, the barrier metal layer and the interconnect material layer B8 are sequentially formed inside the opening portions H6 and H7 (FIG. 16A). As a result, the via plugs 37 are formed on the first lower pad P1 inside the opening portions H6, and the metal pad 38 is formed on the via plugs 37 inside the opening portion H7. In the present modified example, the via plugs 37 function as the lower connection portions P2, and the metal pad 38 functions as the second lower pad P3. FIG. 16B is a perspective view corresponding to FIG. 16A.

In this manner, the interconnect layer 36, the via plugs 37 and the metal pad 38 are formed above the substrate 15 for the circuit wafer W2. In a similar manner, the interconnect layer 43, the via plug 42 and the metal pad 41 are formed above the substrate 16 for the array wafer W1. The semiconductor device in FIG. 1 is manufactured by the method in FIG. 3 being executed thereafter.

The first lower pad P1 (interconnect layer 36), the lower connection portions P2 (via plugs 37) and the second lower pad P2 (metal pad 38) in the present modified example have the same structures as the structures of the first lower pad 38a, the lower connection portions 38b and the second lower pad 38c in the first embodiment (FIG. 4A). That is, in the present modified example, the same structure as the structure of the metal pad 38 in the first embodiment is realized with the interconnect layer 36, the via plugs 37 and the metal pad 38. By this means, it is, for example, possible to reduce the number of interconnect layers (including pad layers) of the circuit wafer W2.

In a similar manner, in the present modified example, the same structure as the structure of the metal pad 41 in the first embodiment is realized with the interconnect layer 43, the via plugs 42 and the metal pad 41. By this means, it is, for example, possible to reduce the number of interconnect layers (including pad layers) of the array wafer W1. In this case, the first upper pad is realized with the metal pad 41, a plurality of upper connection portions are realized with a plurality of via plugs 42, and the second upper pad is realized with the interconnect layer 43. The second upper pad is electrically connected to an interconnect inside the interconnect layer 43, and this interconnect is electrically connected to a via plug inside the interconnect layer 43.

As described above, the metal pad 38 in the present embodiment includes the first lower pad 38a, a plurality of lower connection portions 38*b*, and a second lower pad 38*c*, and the metal pad 41 in the present embodiment includes the first upper pad 41*a*, a plurality of upper connection portions 41*b* and the second upper pad 41*c*. Therefore, according to the present embodiment, it is possible to improve a yield of the semiconductor device due to the metal pads 38, 41 or the like.

While, in the present embodiment, the first lower pad 38*a* is formed with the barrier metal A1 and the interconnect material layer B1, and the lower connection portions 38*b* and the second lower pad 38*c* are formed with the barrier metal A2 and the interconnect material layer B2, instead, part of the first lower pad 38*a* may be formed with the barrier metal A1 and the interconnect material layer B1, and the rest part of the first lower pad 38*a*, the lower connection portions 38*b* and the second lower pad 38*c* may be formed with the barrier metal A2 and the interconnect material layer B2. In this case, the barrier metal A2 is put between part of the first lower pad 38*a* and the rest part of the first lower pad 38*a*.

Second Embodiment

Figure 17A:
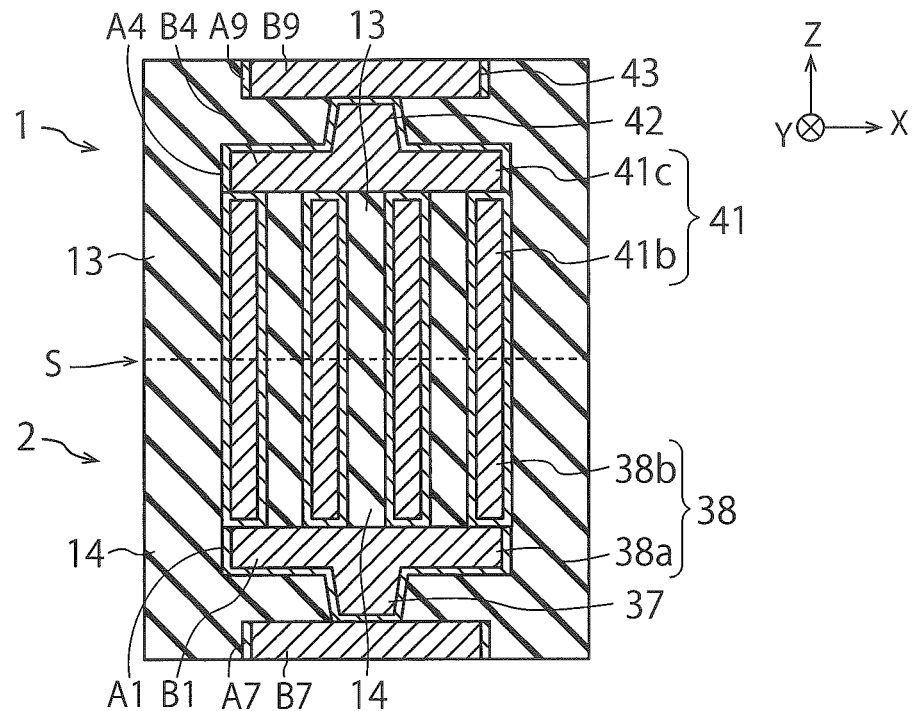
FIGS. 17A to 17C are a sectional view and perspective views illustrating structures of a metal pad, or the like, in a second embodiment.
Figure 17B:
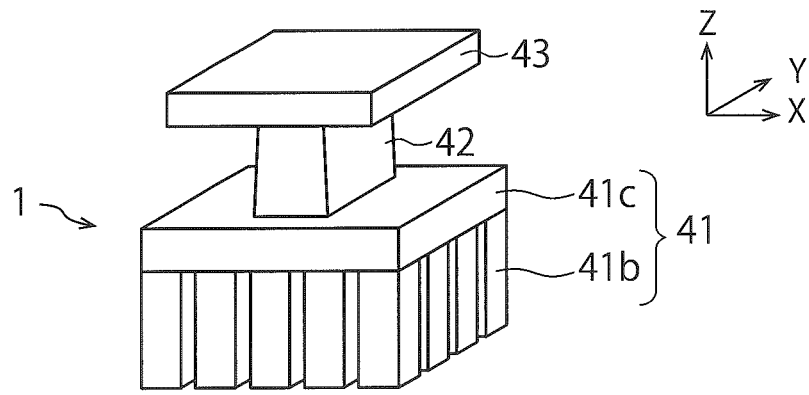
Figure 17C:
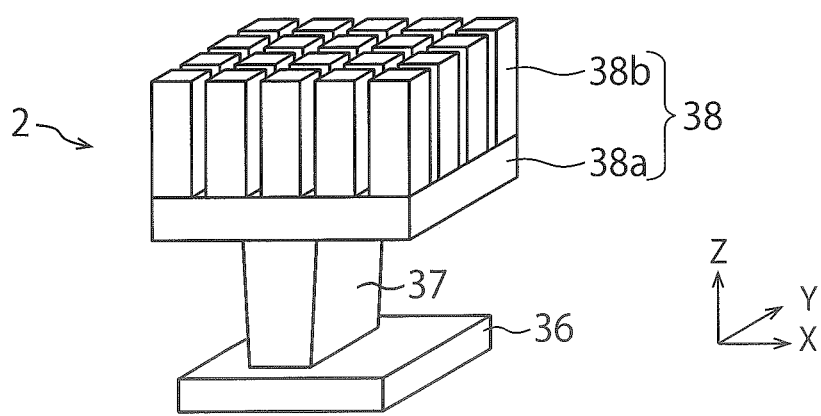

FIGS. 17A to 17C are a sectional view and perspective views illustrating structures of the metal pads 38, 41, or the like, in the second embodiment.

FIG. 17A is a sectional view illustrating a pair of the metal pads 38 and 41 which are electrically connected to each other. FIG. 17B is a perspective view illustrating the metal pad 41 in FIG. 17A. FIG. 17C is a perspective view illustrating the metal pad 38 in FIG. 17A.

The structures of the metal pads 38, 41, or the like, will be described below with reference to FIG. 17A. This description will be provided also with reference to FIG. 17B and FIG. 17C as appropriate.

While the metal pad 38 in the present embodiment includes the first lower pad 38*a* provided on the via plug 37 and a plurality of lower connection portions 38*b* provided on the first lower pad 38*a*, the metal pad 38 does not include the second lower pad 38*c* as in the first embodiment. The metal pad 41 in the present embodiment is provided on these lower connection portions 38*b*.

While the metal pad 41 in the present embodiment includes a plurality of upper connection portions 41*b* provided on these lower connection portions 38*b*, and the second upper pad 41*c* provided on these upper connection portions 41*b*, the metal pad 41 does not include the first upper pad 41*a* as in the first embodiment. The via plug 42 is provided on the second upper pad 41*c*. The interconnect layer 43 on the via plug 42 sequentially includes a barrier metal layer A9 and an interconnect material layer B9. The barrier metal layer A9 is, for example, a Ti containing layer or a Ta containing layer. The interconnect material layer B9 is, for example, a Cu layer.

As described above, the metal pad 38 in the present embodiment includes the first lower pad 38*a* which is electrically connected to the plurality of lower connection portions 38*b*. These lower connection portions 38*b* are separated from each other by the inter layer dielectric 14. While FIG. 17C illustrates the lower connection portions 38*b* of 5×4 arranged in a quadrangle grid shape, the number and arrangement of the lower connection portions 38*b* are not limited to these.

In a similar manner, the metal pad 41 in the present embodiment includes the second upper pad 41*c* which is electrically connected to a plurality of upper connection portions 41*b*. These upper connection portions 41*b* are separated from each other by the inter layer dielectric 13.

While FIG. 17B illustrates the upper connection portions 41*b* of 5×4 arranged in a quadrangle grid shape, the number and arrangement of the upper connection portions 41*b* are not limited to these.

While, in a pair of the metal pads 38 and 41 in the present embodiment, the number of the upper connection portions 41*b* is the same as the number of the lower connection portions 38*b*, the number of the upper connection portions 41*b* may be different from the number of the lower connection portions 38*b*. While, in a pair of the metal pads 38 and 41 in the present embodiment, further, the arrangement of the upper connection portions 41*b* is the same as the arrangement of the lower connection portions 38*b*, the arrangement of the upper connection portions 41*b* may be different from the arrangement of the lower connection portions 38*b*. For example, it is also possible to set the number of the lower connection portions 38*b* at 20, set the number of the upper connection portions 41*b* at 10, and arrange one upper connection portion 41*b* on two lower connection portions 38*b*.

According to the present embodiment, in a similar manner to the first embodiment, it is possible to reduce defects of the metal pads 38 and 41 and the via plugs 37 and 42 of the metal pads 38 and 41 due to a void, so that it is possible to improve a yield of the semiconductor device. Further, according to the present embodiment, as will be described later, it is possible to reduce defects of the metal pads 38 and 41 due to dishing.

Figure 18A:
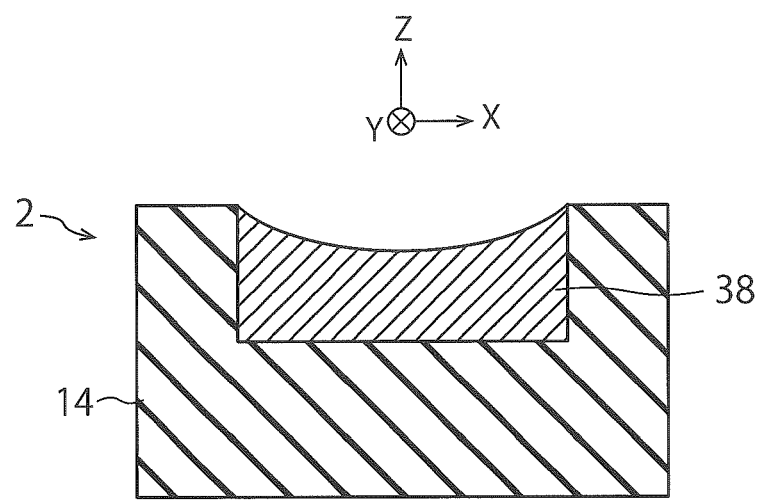
FIGS. 18A and 18B are sectional views for comparing structures of a metal pad, or the like, between the second embodiment and a comparative example of the second embodiment.
Figure 18B:
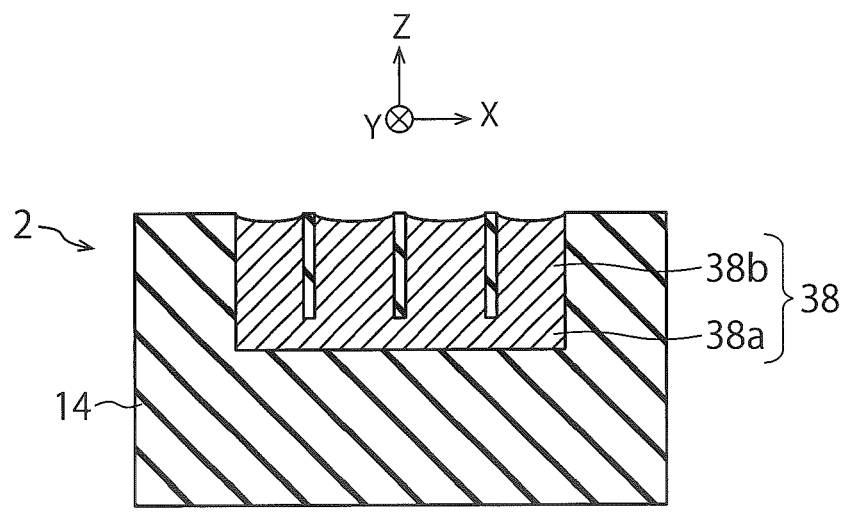

FIGS. 18A and 18B are sectional views for comparing structures of the metal pad 38, or the like, between the second embodiment and a comparative example of the second embodiment.

FIG. 18A illustrates a cross-section of the metal pad 38 in the comparative example of the second embodiment. The metal pad 38 in this comparative example has a relatively large size. Therefore, if a surface of the metal pad 38 is planarized through CMP, as illustrated in FIG. 18A, there is a possibility that large dishing (concave portion) may be formed on the surface of the metal pad 38. This also applies to the metal pad 41. In this case, when the metal pad 38 is bonded to the metal pad 41, there is a possibility that a defect may occur in bonding between the metal pads 38 and 41.

FIG. 18B illustrates a cross-section of the metal pad 38 in the second embodiment. When the surface of the metal pad 38 in the present embodiment is planarized through CMP, dishing is formed at each lower connection portion 38*b* whose size is small, instead of being formed at the first lower pad 38*a* whose size is large. Therefore, as illustrated in FIG. 18B, a size of dishing is small. This also applies to the metal pad 41. Therefore, according to the present embodiment, when the metal pad 38 is bonded to the metal pad 41, a defect is less likely to occur in bonding between the metal pads 38 and 41.

Figure 19A:
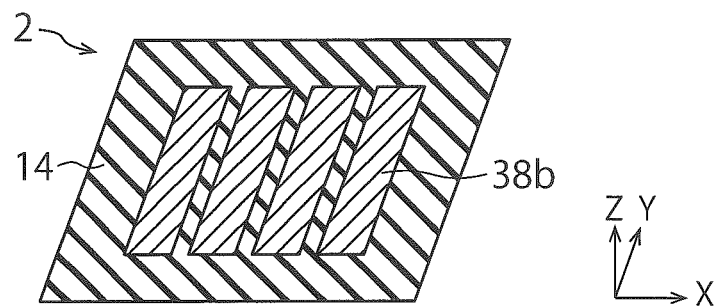
FIGS. 19A to 19C are sectional views illustrating structures of the metal pad, or the like, in the second embodiment.
Figure 19B:
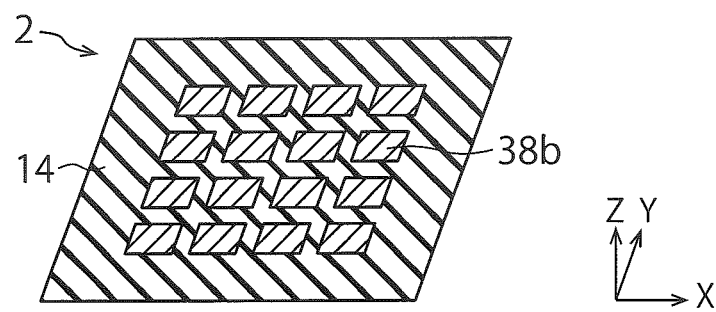
Figure 19C:
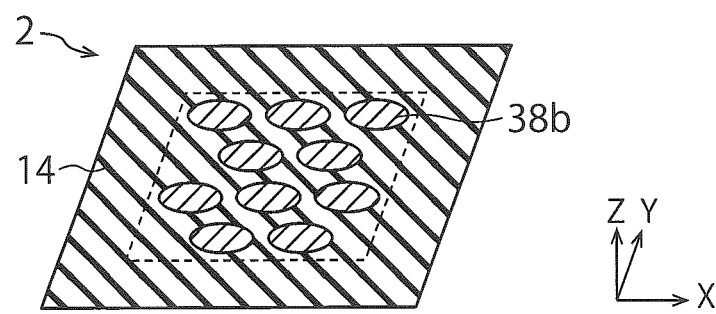

FIGS. 19A to 19C are sectional views illustrating structures of the metal pad 38, or the like, in the second embodiment.

FIGS. 19A, 19B and 19C respectively illustrate first, second and third examples of the shape of an XY cross-section of the lower connection portions 38*b*. The lower connection portions 38*b* in FIG. 19A are arranged in a one-dimensional array shape, are adjacent to each other in the X direction, and extend in the Y direction. The lower connection portions 38*b* in FIG. 19B are arranged in a two-dimensional array shape, and, specifically, arranged in a quadrangle grid shape. The lower connection portions 38*b* in FIG. 19C are arranged in a two-dimensional array shape, and, specifically, arranged in a triangle grid shape. Each lower connection portion 38b in FIG. 19B has a quadrangular planar shape, and each lower connection portion 38b in FIG. 19C has a circular planar shape. The metal pad 38 in the present embodiment includes the lower connection portions 38b in any shape.

The shape of the upper connection portions 41b in the present embodiment can be set in a shape similar to that in these examples.

The metal pad 38 in the present embodiment can be formed by, for example, process of forming the opening portion H4 being omitted from the process from FIGS. 9A to 11C. The metal pad 41 in the present embodiment can be similarly formed. Meanwhile, these metal pads 38 and 41 can be also formed using the following method.

FIGS. 20A to 21C are sectional views and a perspective view illustrating a method of manufacturing the semiconductor device in the second embodiment. Here, process of forming the metal pad 38, or the like, above the substrate 15 for the circuit wafer W2 will be described. This description can be also applied to process of forming the metal pad 41, or the like, above the substrate 16 for the array wafer W1.

Figure 20A:
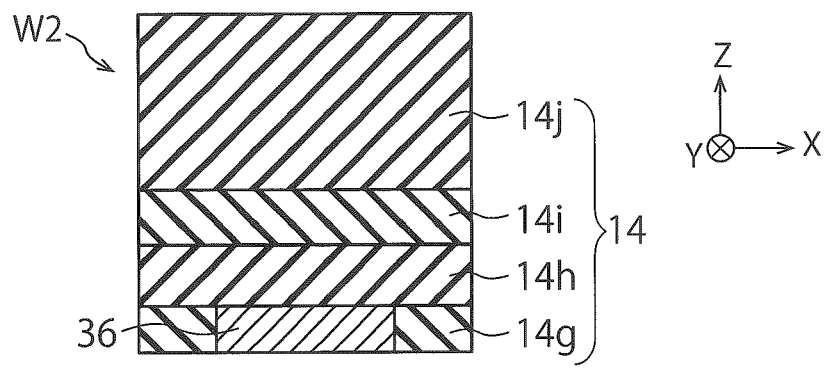
FIGS. 20A to 21C are sectional views and a perspective view illustrating a method of manufacturing a semiconductor device in the second embodiment.

First, the interconnect layer 36 is formed above the substrate 15 (see FIGS. 1 and 3) (FIG. 20A). FIG. 20A illustrates the interconnect layer 36 formed inside an insulator 14g constituting the inter layer dielectric 14. The insulator 14g is, for example, an SiO₂ film.

Figure 20B:
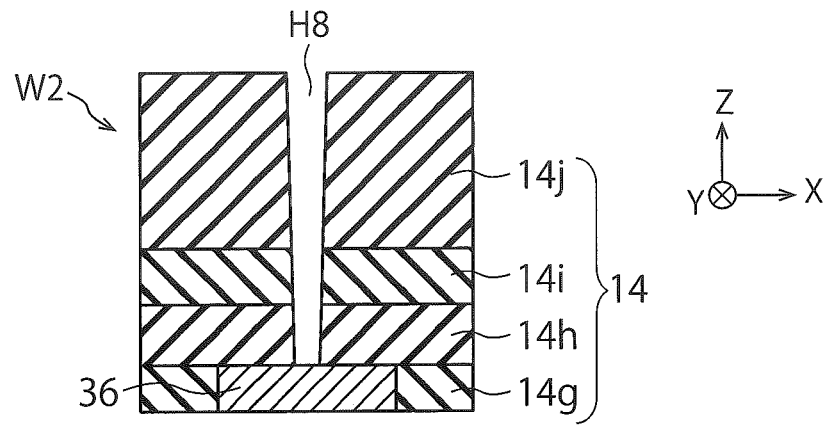

Then, insulators 14h, 14i and 14j are sequentially formed on the interconnect layer 36 and the insulator 14g (FIG. 20B). The insulator 14h is, for example, an SiO₂ film. The insulator 14i is, for example, an SiN film (silicon nitride film). The insulator 14j is, for example, an SiO₂ film.

Figure 20C:
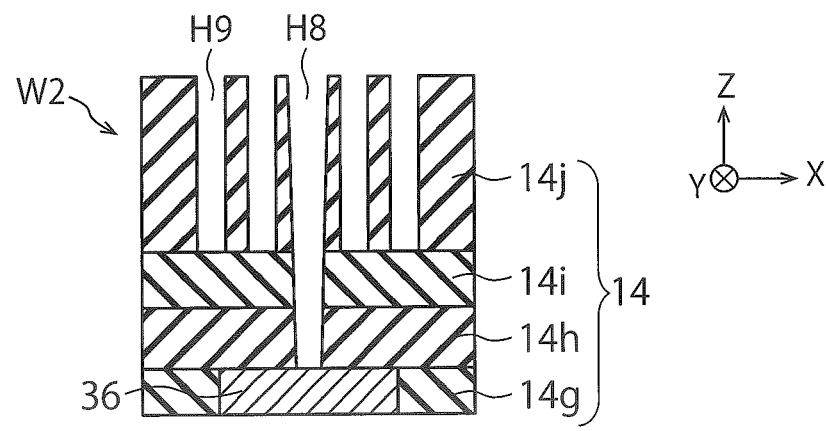
Figure 21A:
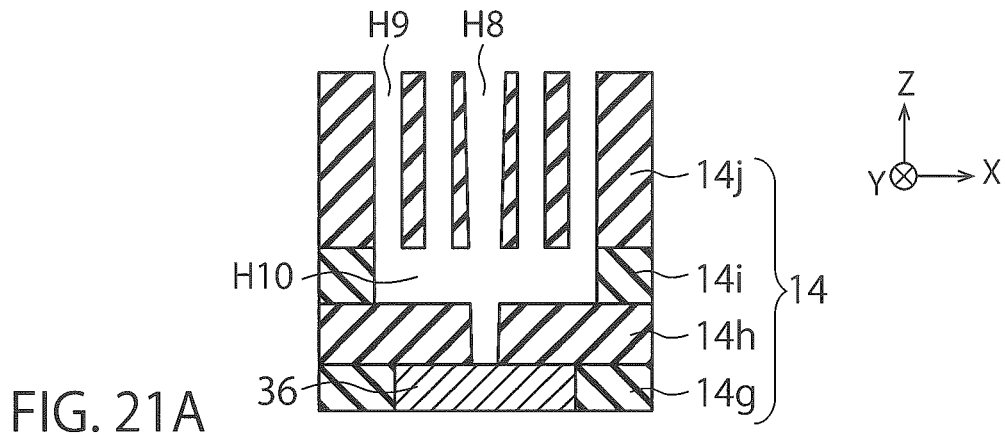
Figure 21B:
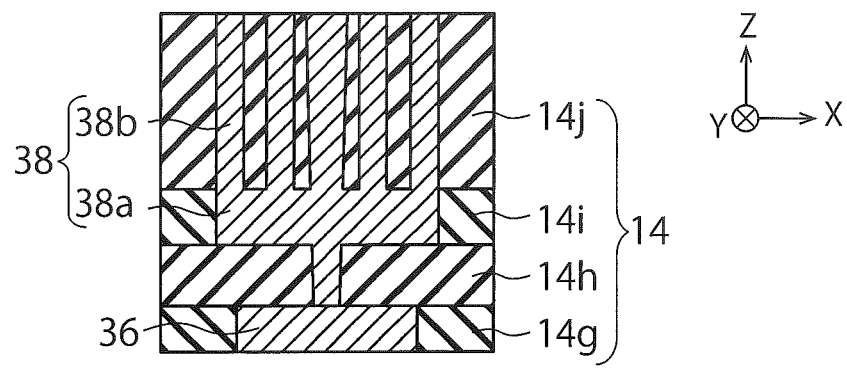

Then, the opening portion H8 which penetrates through the insulators 14h, 14i and 14j is formed (FIG. 20B). Then, a plurality of opening portions H9 which penetrate through the insulator 14j are formed (FIG. 20C). Then, the insulator 14i between the opening portion H8 and the opening portions H9 is removed to form an opening portion H10 which connects the opening portion H8 and the opening portions H9 (FIG. 21A).

A film between the insulator 14h and the insulator 14j may be a film including an insulator (for example, an SiO₂ film) and a semiconductor film (for example, an amorphous silicon film) in place of the insulator 14i. In this case, a portion removed in the process in FIG. 21B from the film between the insulator 14h and the insulator 14j may be made the semiconductor film, and a portion not removed in the process in FIG. 21B may be made the insulator.

Figure 21C:
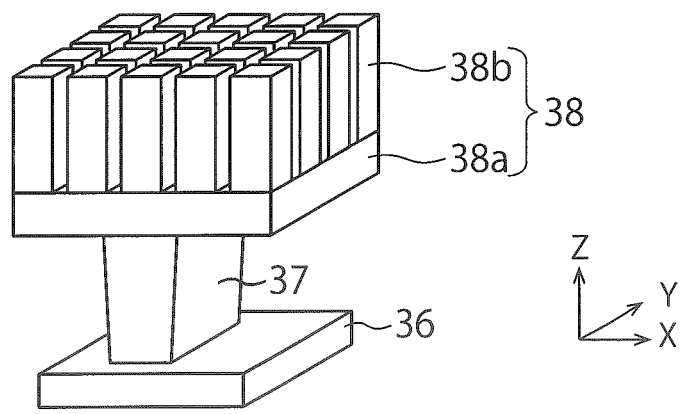

Then, a barrier metal layer and an interconnect material layer are sequentially formed inside the opening portions H8, H9 and H10 (FIG. 21C). As a result, the via plug 37 is formed inside the insulator 14h, the first lower pad 38a is formed inside the insulator 14i, and the lower connection portions 38b are formed inside the insulator 14j. FIG. 21C is a perspective view corresponding to FIG. 21B.

In this manner, the interconnect layer 36, the via plug 37 and the metal pad 38 are formed above the substrate 15 for the circuit wafer W2. In a similar manner, the interconnect layer 43, the via plug 42 and the metal pad 41 are formed above the substrate 16 for the array wafer W1. The second upper pad 41c and the upper connection portions 41b of the metal pad 41 can be formed in a similar manner respectively to the first lower pad 38a and the lower connection portions 38b of the metal pad 38. The semiconductor device in FIG. 1 is manufactured by the method in FIG. 3 being executed thereafter.

Figure 22A:
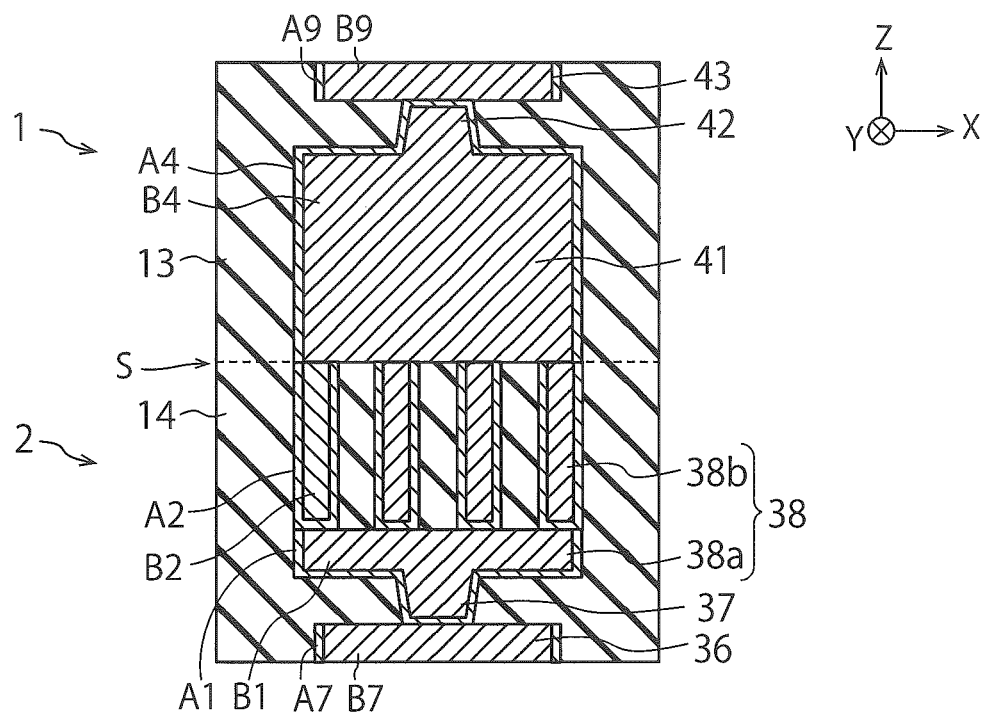
FIGS. 22A and 22B are sectional views illustrating structures of a metal pad, or the like, in first and second modified examples of the second embodiment.
Figure 22B:
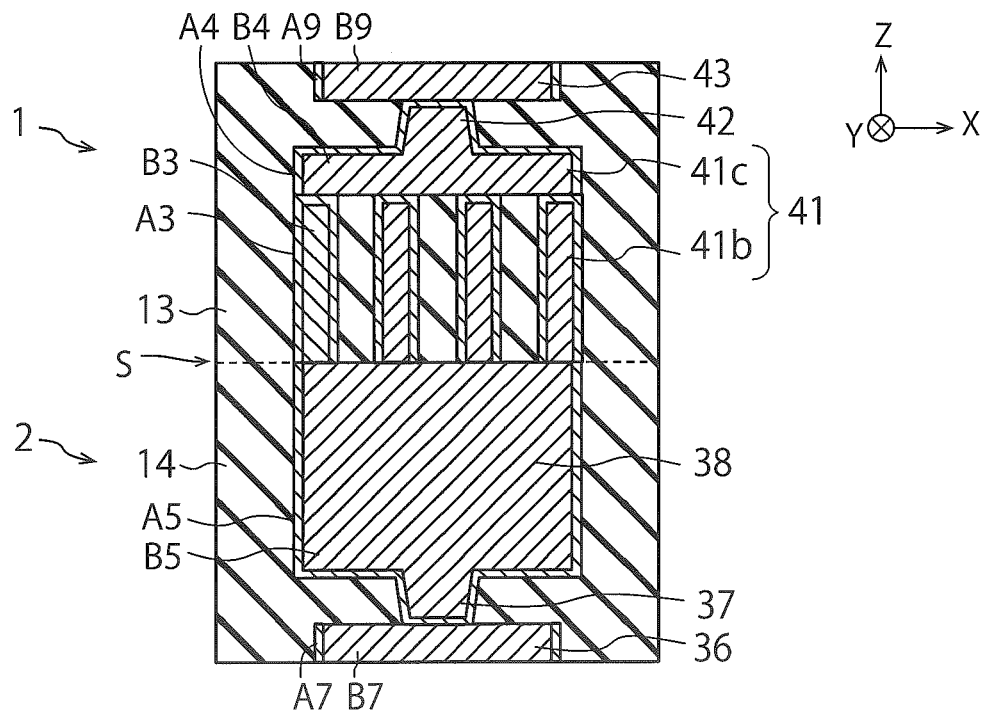

FIGS. 22A and 22B are sectional views illustrating structures of metal pads 38, 41, or the like, in first and second modified examples of the second embodiment.

FIG. 22A illustrates the metal pads 38 and 41 in the first modified example. The metal pad 38 in the present modified example has the same structure as the structure of the metal pad 38 (FIG. 17A) in the second embodiment. Meanwhile, the metal pad 41 in the present modified example has the same structure as the structure of the metal pad 41 (FIG. 6A) in the comparative example of the first embodiment. By this means, it is possible to reduce defects of the metal pad 38 and the via plug 37 of the metal pad 38 due to a void, so that it is possible to improve a yield of the semiconductor device.

Meanwhile, FIG. 22B illustrates the metal pads 38 and 41 in the second modified example. The metal pad 38 in the present modified example has the same structure as the structure of the metal pad 38 (FIG. 6A) in the comparative example of the first embodiment. Meanwhile, the metal pad 41 in the present modified example has the same structure as the structure of the metal pad 41 (FIG. 17A) in the second embodiment. By this means, it is possible to reduce defects of the metal pad 41 and the via plug 42 of the metal pad 41 due to a void, so that it is possible to improve a yield of the semiconductor device.

The metal pad 41 in FIG. 22A and the metal pad 38 in FIG. 22B can be formed by process from FIGS. 10B to 11C being omitted from the process from FIGS. 9A to 11C. However, in this case, a film thickness of the insulator 14b is made thicker, and a depth of the opening portion H2 is made deeper.

As described above, the metal pad 38 in the present embodiment includes the first lower pad 38a and a plurality of lower connection portions 38b, and the metal pad 41 in the present embodiment includes a plurality of upper connection portions 41b and the second upper pad 41c. Therefore, according to the present embodiment, it is possible to improve a yield of the semiconductor device due to the metal pads 38, 41 or the like.

While, in the present embodiment, the first lower pad 38a is formed with the barrier metal A1 and the interconnect material layer B1, and the lower connection portions 38b are formed with the barrier metal A2 and the interconnect material layer B2, instead, part of the first lower pad 38a may be formed with the barrier metal A1 and the interconnect material layer B1, and the rest part of the first lower pad 38a and the lower connection portions 38b may be formed with the barrier metal A2 and the interconnect material layer B2. In the former case, a structure in which a plurality of pairs of the barrier metal A2 and the interconnect material layer B2 constitute a plurality of lower connection portions 38b is realized. In the latter case, a structure in which a pair of the barrier metal A2 and the interconnect material layer B2 having a comb shape constitutes the plurality of lower connection portions 38b and the rest part of the first lower pad 38a is realized.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device, comprising:
a first chip including a first interconnect layer;
a second chip bonded to the first chip, and including a second interconnect layer; and
a metal pad provided on a bonding face of the first chip and the second chip and electrically connecting a first interconnect in the first interconnect layer to a second interconnect in the second interconnect layer,
wherein the metal pad includes a first portion provided in the first chip,
the first portion includes a first pad, and a plurality of first connection portions provided directly on and above the first pad,
one of the plurality of first connection portions includes a first metal body and a first barrier metal layer covering a part of an outer periphery of the first metal body, and
the first metal body of one of the plurality of first connection portions is in contact with the first pad via the first barrier metal layer.

2. The device of claim 1, wherein the metal pad further includes a second portion provided on the first portion in the first chip,
the second portion includes a second pad, and a plurality of second connection portions provided directly on and under the second pad,
one of the plurality of second connection portions includes a second metal body and a second barrier metal layer covering a part of an outer periphery of the second metal body, and
the second metal body of one of the plurality of second connection portions is in contact with the second pad via the second barrier metal layer.

3. The device of claim 2, wherein a number of the second connection portions is equal to a number of the first connection portions.

4. The device of claim 1, wherein
the metal pad further includes a third pad provided on the plurality of first connection portions and under the plurality of second connection portions.

5. The device of claim 4, wherein the metal pad further includes a fourth pad provided on the third pad and under the plurality of second connection portions.

6. The device of claim 5, wherein a number of the second connection portions is equal to a number of the first connection portions.

7. The device of claim 4, wherein the third pad is provided on the first connection portions via no barrier metal layer.

8. The device of claim 5, wherein the fourth pad is provided on the third pad via no barrier metal layer.

9. The device of claim 1, wherein
the first pad is provided in the first interconnect layer, or the second pad is provided in the second interconnect layer.

* * * * *